(12) United States Patent
Kim et al.

(10) Patent No.: US 12,085,994 B2
(45) Date of Patent: Sep. 10, 2024

(54) ELECTRONIC DEVICE INCLUDING CONTACT STRUCTURE USING MAGNET

(71) Applicant: SAMSUNG ELECTRONICS CO., LTD., Suwon-si (KR)

(72) Inventors: Hyungjin Kim, Suwon-si (KR); Jaehyung Kim, Suwon-si (KR)

(73) Assignee: SAMSUNG ELECTRONICS CO., LTD, Suwon-si (KR)

( * ) Notice: Subject to any disclaimer, the term of this patent is extended or adjusted under 35 U.S.C. 154(b) by 76 days.

(21) Appl. No.: 18/089,087

(22) Filed: Dec. 27, 2022

(65) Prior Publication Data
US 2023/0129591 A1  Apr. 27, 2023

Related U.S. Application Data

(63) Continuation of application No. PCT/KR2021/016571, filed on Nov. 12, 2021.

(30) Foreign Application Priority Data

Nov. 13, 2020  (KR) ............... 10-2020-0152050
Dec. 23, 2020  (KR) ............... 10-2020-0182329

(51) Int. Cl.
G06F 1/16  (2006.01)

(52) U.S. Cl.
CPC .......... *G06F 1/1656* (2013.01); *G06F 1/1624* (2013.01); *G06F 1/1652* (2013.01)

(58) Field of Classification Search
CPC .... G06F 1/1624; G06F 1/1652; G06F 1/1656; G06F 1/1698
See application file for complete search history.

(56) References Cited

U.S. PATENT DOCUMENTS 4,992,799 A * 2/1991 Garay ............... H01Q 7/00
                                                343/866
7,079,079 B2 * 7/2006 Jo .................. H01Q 9/0442
                                                343/702

(Continued)

FOREIGN PATENT DOCUMENTS

JP  2011-146781  7/2011
JP  2011-217184  10/2011

(Continued)

OTHER PUBLICATIONS

International Search Report dated Mar. 3, 2022 issued in PCT/KR2021/016571 (4 pages).

(Continued)

*Primary Examiner* — Adrian S Wilson
(74) *Attorney, Agent, or Firm* — Nixon & Vanderhye, P.C.

(57) ABSTRACT

An electronic device according to various embodiments of the disclosure may include: a housing including a first housing and a second housing, a wireless communication circuit, and at least one contact structure comprising a conductor, wherein the first housing may include a ground and the second housing may include a conductive portion, wherein, in a first state, the second housing may be configured to move in a first direction to be changed to a second state and, in a second state, the second housing may be configured to move in a second direction to be change to the first state, and wherein, in the first state, the at least one contact structure may be configured to electrically connect the ground of the first housing to the conductive portion of the second housing, and the wireless communication circuit may be configured to receive a signal by feeding power to a point of the conductive portion of the second housing.

20 Claims, 29 Drawing Sheets

(56) References Cited

U.S. PATENT DOCUMENTS

| | | | |
|---|---|---|---|
| 7,539,527 B2 | 5/2009 | Jang et al. | |
| 8,154,460 B2 * | 4/2012 | Sakata | H01Q 1/243 |
| | | | 343/702 |
| 8,442,602 B2 * | 5/2013 | Wong | H04B 1/3838 |
| | | | 343/702 |
| 8,489,160 B2 | 7/2013 | Xiao et al. | |
| 8,954,122 B2 * | 2/2015 | Wilmhoff | H01Q 1/243 |
| | | | 343/718 |
| 10,075,569 B2 | 9/2018 | Kim et al. | |
| 10,079,425 B2 | 9/2018 | Chun et al. | |
| 10,090,578 B2 * | 10/2018 | Wolentarski | H01Q 1/245 |
| 10,129,376 B2 | 11/2018 | Cho et al. | |
| 10,177,443 B2 * | 1/2019 | Xue | H01Q 9/42 |
| 10,193,213 B2 * | 1/2019 | Liu | G06F 1/1641 |
| 10,321,583 B2 | 6/2019 | Seo et al. | |
| 11,470,729 B2 | 10/2022 | Kim et al. | |
| 2009/0005134 A1 | 1/2009 | Abdul-Gaffoor et al. | |
| 2013/0009829 A1 * | 1/2013 | Kurihara | H01Q 9/42 |
| | | | 343/702 |
| 2015/0011273 A1 * | 1/2015 | Wilmhoff | H04B 5/72 |
| | | | 343/702 |
| 2018/0168040 A1 | 6/2018 | Raja et al. | |
| 2019/0103656 A1 | 4/2019 | Shi et al. | |
| 2019/0302842 A1 | 10/2019 | Sun et al. | |

FOREIGN PATENT DOCUMENTS

| | | |
|---|---|---|
| KR | 10-0725054 | 6/2007 |
| KR | 10-0726234 | 6/2007 |
| KR | 10-0846555 | 7/2008 |
| KR | 10-2011-0092975 | 8/2011 |
| KR | 10-1069752 | 10/2011 |
| KR | 10-1144252 | 5/2012 |
| KR | 10-1284269 | 7/2013 |
| KR | 10-1427257 | 8/2014 |
| KR | 10-2017-0056292 | 5/2017 |
| KR | 10-2018-0039799 | 4/2018 |
| KR | 10-2019-0143029 | 12/2019 |
| KR | 10-2060733 | 12/2019 |
| KR | 10-2020-0119107 | 10/2020 |
| WO | 2011/125569 | 10/2011 |

OTHER PUBLICATIONS

Written Opinion of ISA dated Mar. 3, 2022 issued in PCT/KR2021/016571 (4 pages).

* cited by examiner

ELECTRONIC DEVICE INCLUDING CONTACT STRUCTURE USING MAGNET

CROSS-REFERENCE TO RELATED APPLICATIONS

This application is a continuation of International Application No. PCT/KR2021/016571 designating the United States, filed on Nov. 12, 2021, in the Korean Intellectual Property Receiving Office and claiming priority to Korean Patent Application No. 10-2020-0152050, filed on Nov. 13, 2020, in the Korean Intellectual Property Office and Korean Patent Application No. 10-2020-0182329, filed on Dec. 23, 2020, in the Korean Intellectual Property Office, the disclosures of all of which are incorporated by reference herein in their entireties.

BACKGROUND

Field

The disclosure relates to an electronic device including a contact structure using a magnet.

Description of Related Art

With the development of display technology, various types of display devices are being developed. For example, the distribution rate of display devices, such as a computer, a tablet PC, or a mobile phone, is high, and efforts are being made to develop a display device in a new form in order to meet the needs of users who want newer and more diverse functions.

As an example of a next-generation display device on which such efforts are being made, there is a flexible display device. A portable electronic device may include a display having a relatively large area in order to provide a wide screen. However, since the size of the electronic device also increases as the size of the display increases, there may be a limit to the size of the display. In order to overcome this limit, in a flexible display as a next-generation display device, a portion of the display may be selectively entered into a housing.

When a first conductive portion serving as an antenna radiator is close to a second conductive portion of a housing, a current flowing in the first conductive portion may be coupled to the second conductive portion, resulting in parasitic resonance. When the parasitic resonance overlaps the frequency band of the antenna radiator, the parasitic resonance may be a factor to deteriorate the radiation performance of the antenna. In order to eliminate an induced current in the coupled second conductive portion, the other conductive portion may be grounded with the ground of the antenna.

In the case of a rollable electronic device, parasitic resonance may be removed by connecting a floating second conductive portion to the ground via a contact structure. However, in the rollable electronic device, as the second housing slides within a predetermined range relative to the first housing, it may be difficult to implement a contact structure for extension of ground. For example, since the second housing slides relative to the first housing, the contact structure may be worn out due to friction.

SUMMARY

Embodiments of the disclosure are capable of providing a contact structure for grounding with a ground in a rollable electronic device and capable of preventing and/or reducing damage to the contact structure using a magnet.

An electronic device according to various example embodiments may include: a housing including a first housing and a second housing, a wireless communication circuit, and at least one contact structure. The first housing may include a ground, and the second housing may be connected to the first housing to be slidable, and may include a conductive portion. In a first state, the second housing may move in a first direction away from the first housing to be changed to a second state, and in a second state, the second housing may move in a second direction opposite the first direction to be changed to the first state. The at least one contact structure comprising a conductor may be configured to electrically connect the ground of the first housing to the conductive portion of the second housing in the first state, and the wireless communication circuit may be configured to receive a signal of a specified frequency band by feeding power to a point of the conductive portion of the second housing.

An electronic device according to various example embodiments may include: a housing including a first housing and a second housing, a wireless communication circuit, and at least one contact structure comprising a conductor. The second housing may be connected to the first housing to be slidable, and may include a conductive portion. A conductive structure comprising a conductive material may be disposed in the housing, and the conductive structure may include a ground in at least one portion thereof. In a first state, the second housing may move in a first direction away from the first housing to be changed to a second state, and in a second state, the second housing may move in a second direction opposite the first direction to be changed to the first state. The at least one contact structure comprising a conductor may be configured to electrically connect the ground of the conductive structure to the conductive portion of the second housing in the first state, and the wireless communication circuit may be configured to receive a signal of a specified frequency band by feeding power to a point of the conductive portion of the second housing.

An electronic device according to various example embodiments may include: a housing including a first housing and a second housing, a wireless communication circuit, and at least one contact structure comprising a conductor. The first housing may include a first ground in one region, and the second housing may be connected to the first housing to be slidable and may include a second ground in a region. In a first state, the second housing may move in a first direction away from the first housing to be changed to a second state, and in a second state, the second housing may move in a second direction opposite to first direction to be changed to the first state. The at least one contact structure may comprise a conductor and be configured to electrically connect the first ground to the second ground in the first state, the conductive portion of the housing may be electrically connected to at least one of the first ground and the second ground, and the wireless communication circuit may be configured to receive a signal of a specified frequency band by feeding power to a point of the conductive portion.

According to various example embodiments disclosed herein, by electrically connecting the conductive portion of the housing and/or the ground of the printed circuit board, it is possible to remove and/or reduce parasitic resonance and improve antenna radiation performance.

In addition, according to various example embodiments, since the contact structure of the electronic device uses the magnet when electrically connecting the ground to the conductive portion. Thus, it is possible to prevent and/or reduce the contact structure from being worn out due to friction.

In addition, various effects directly or indirectly identified through this document may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Hereinafter, various example embodiments of the disclosure will be described with reference to the accompanying drawings. However, it shall be understood that it is not intended to limit the disclosure to specific embodiments, and that the disclosure includes various modifications, equivalents, or alternatives of the embodiments of the disclosure.

Figure 1A:
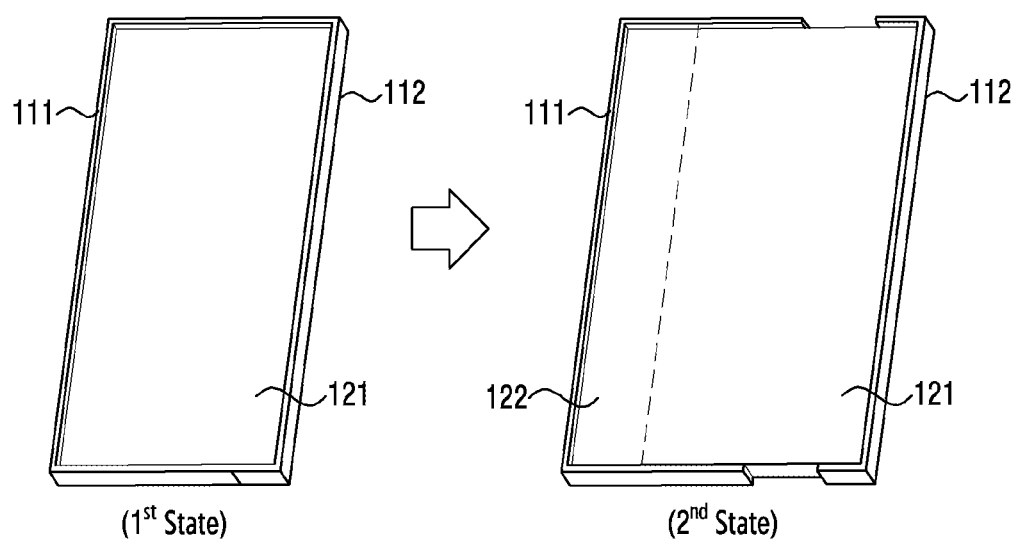
FIG. 1A is a front perspective view of an electronic device which extends in a first direction according various embodiments.
Figure 1A:
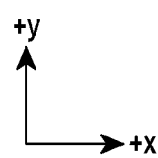

FIG. 1A is a front perspective view of an electronic device which extends in a first direction according to various embodiments.

Figure 1B:
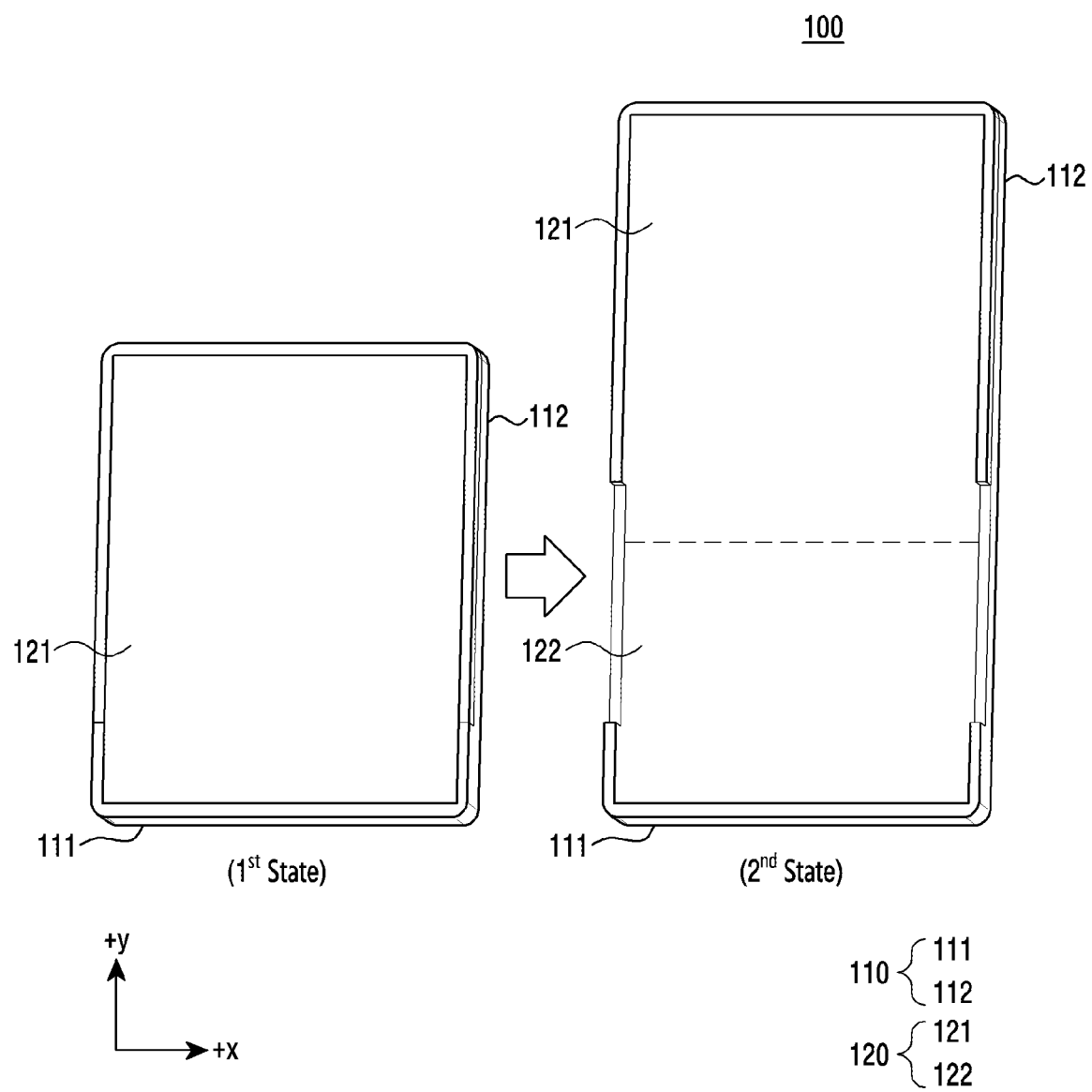
FIG. 1B is a front perspective view of an electronic device which extends in a second direction according to various embodiments.

FIG. 1B is a front perspective view of an electronic device which extends in a second direction according to various embodiments.

Referring to FIGS. 1A and 1B, in an embodiment, an electronic device 100 may include a housing 110 and a flexible display 120.

According to various embodiments disclosed herein, the surface on which the flexible display 120 is disposed may be defined as the front surface of the electronic device 100, and the surface opposite to the front surface may be defined as the rear surface of the electronic device 100. A surface surrounding the space between the front surface and the rear surface may be defined as a side surface of the electronic device 100.

According to an embodiment, the housing 110 may form a partial region of the front surface, the rear surface, and the side surface of the electronic device 100. According to an embodiment, the housing 110 may form a partial region of the side surface and the rear surface of the electronic device 100. In an embodiment, the housing 110 may include a conductive material (e.g., metal).

According to an embodiment, the housing 110 may include a first housing 111 and a second housing 112 coupled to the first housing 111 to be movable relative to the first housing 111 within a predetermined range.

According to an embodiment, the flexible display 120 may occupy most of the front surface of the electronic device 100. For example, the front surface of the electronic device 100 may include the flexible display 120 and a bezel region partially surrounding the edges of the flexible display 120.

According to an embodiment, the flexible display 120 may be disposed to include at least a portion of a flat shape and at least a portion of a curved shape.

According to an embodiment, the electronic device 100 may have a first state or a second state.

In an embodiment, the first state and the second state of the electronic device 100 may be determined depending on a relative position of the second housing 112 with respect to the first housing 111. For example, the state of the electronic device 100 in which the first housing 111 and the second housing 112 are adjacent to each other may be referred to as the first state. As another example, the state of the electronic device 100 in which the second housing 112 slides in the +x direction in the first state and thus moves away from the first housing 111 may be referred to as the second state. As another example, the state in which the portion visually visible to the outside of the flexible display 120 is the smallest may be referred to as the first state, and the state in which the portion visually visible to the flexible display 120 is extended more than the first state may be referred to as the second state. For example, the second state may be the state in which the portion in which the flexible display 120 is visible to the outside is the largest. As another example, the state between the first state and the second state may be referred to as a third state or an intermediate state.

In an embodiment, the electronic device 100 may be converted (e.g., changed) between the first state and the second state by a user's manipulation or a mechanical operation.

According to an embodiment, the flexible display 120 may include a first portion 121 and a second portion 122.

According to an embodiment, the first portion 121 of the flexible display 120 may be referred to as a portion of the flexible display 120 that is viewed to the outside in the first state. In an embodiment, the second portion 122 of the flexible display 120 may be entered into the housing 110 or pulled out of the housing 110 according to a change in the state of the electronic device 100.

According to an embodiment, the second portion 122 of the flexible display 120 may be pulled out or entered into the housing 110 as the second housing 112 moves. For example, while the electronic device 100 is being converted from the first state to the second state, the second housing 112 may move in the +x direction, and the second portion 122 of the flexible display 120 may be pulled out from the inside to the outside of the housing 110.

As another example, while the electronic device 100 is being converted from the second state to the first state, the second housing 112 may move in the −x direction, and the second portion 122 of the flexible display 120 may be entered into the housing 110.

According to an embodiment, the positions of the first portion 121 and the second portion 122 of the flexible display 120 may be located opposite to those illustrated in FIG. 1A or 1B.

In various embodiments, when the flexible display 120 is pulled out (or exposed), it may refer, for example, to the pulled-out display portion being viewed from the outside of the electronic device 100, and that when the flexible display 120 is entered, it may refer, for example, to the entered portion of the flexible display 120 not being viewed from the outside of the electronic device 100.

According to an embodiment, the flexible display 120 may emit light from pixels to transmit information to a user, and the light emitted from the pixels is transmitted to the outside of the electronic device 100 through the flexible display 120. In an embodiment, the flexible display 120 may include a protective layer such as tempered glass. In this case, the flexible display 120 may form at least a portion of the front surface of the electronic device 100.

According to an embodiment, the electronic device 100 may extend in the first direction (the +x direction) or the second direction (the +y direction). For example, referring to FIG. 1A, the second housing 112 may slide in the first direction (the +x direction), and the electronic device 100 may extend in the first direction.

As another example, referring to FIG. 1B, the second housing 112 may slide in the second direction (the +y direction), and the electronic device 100 may extend in the second direction.

According to an embodiment, the electronic device 100 may extend in a first direction and a second direction.

The shapes of the electronic devices illustrated in FIGS. 1A and 1B are provided to describe examples of electronic devices capable of extending a display region, and it will be understood that the shape of an electronic device is not limited to those illustrated in FIGS. 1A and 1B.

Figure 2A:
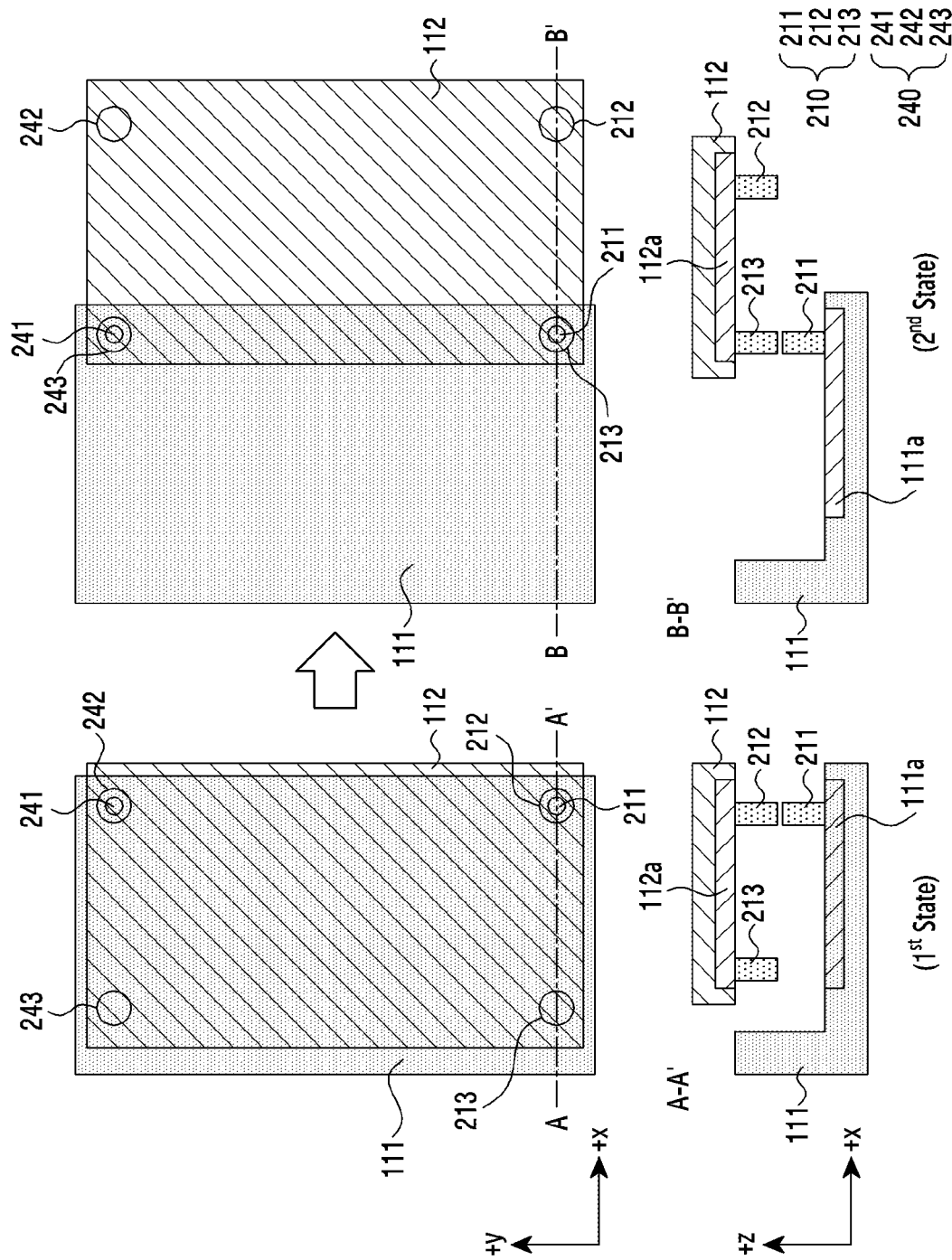
FIG. 2A is a diagram including sectional views illustrating an example contact structure for electrically connecting a first ground of a first housing and a second ground of a second housing to each other according to various embodiments.

FIG. 2A is a diagram including sectional views illustrating an example contact structure for electrically connecting a first ground of a first housing and a second ground of a second housing to each other according to various embodiments.

Referring to FIG. 2A, the electronic device 100 may include a contact structure 210. In an embodiment, the contact structure 210 may include a first structure 211, a second structure 212, and/or a third structure 213. The same reference numerals are used for the same or substantially the same components as those described above, and overlapping descriptions will be omitted.

According to an embodiment, the first structure 211 may be located at a point of a first ground 111a of the first housing 111.

According to an embodiment, the second structure 212 and the third structure 213 may be located at a point of a second ground 112a of the second housing 112 to correspond to the position of the first structure 211. For example, in the first state, the second structure 212 may be located at the first point of the second ground 112a of the second housing 112 at which the second structure 212 may be electrically connected to the first structure 211.

As another example, in the second state, the third structure 213 may be located at the second point of the second ground 112a of the second housing 112 at which the third structure 213 may be electrically connected to the first structure 211.

According to an embodiment, when the electronic device 100 is in the first state or the second state, the first ground 111a of the first housing 111 and the second ground 112a of the second housing 112 may be electrically connected to each other via the contact structure 210. For example, when the electronic device 100 is in the first state, the first structure 211 on the first ground 111a and the second structure 212 on the second ground 112a may be in electrical contact with each other. In this case, the first ground 111a and the second ground 112a may be electrically connected to each other via the first structure 211 and the second structure 212. As another example, when the electronic device 100 is in the second state, the first structure 211 on the first ground 111a and the third structure 213 on the second ground 112a may be in electrical contact with each other. In this case, the first ground 111a and the second ground 112a may be electrically connected to each other via the first structure 211 and the third structure 213.

According to an embodiment, the conductive portion of the first housing 111 to be described in greater detail below with reference to FIG. 2D may be in the state of being electrically connected to the first ground 111a, and as the conductive portion of the first housing 111 serving as an antenna radiator is electrically connected to the first ground 111a and the second ground 112a, the ground of the antenna radiator may be extended. As another example, the conductive portion of the second housing 112 to be described in greater detail below with reference to FIG. 2E may be in the state of being electrically connected to the second ground 112a, and as the conductive portion of the second housing 112 serving as an antenna radiator is electrically connected to the second ground 112a and the first ground 111a, the ground of the antenna radiator may be extended. Through extension of the ground, coupling occurring as the first housing 111 and the conductive portion of the second housing 112 are adjacent to each other may be prevented or reduced.

According to an embodiment, while the second housing 112 slides within a predetermined range, the first ground 111a of the first housing 111 and the second ground 112a of the second housing 112 may not be electrically connected to each other. For example, while the electronic device 100 is converted from the first state to the second state, the first structure 211 on the first ground 111a may be spaced apart from the second structure 212 on the second ground 112a, and thus may not be in electrical contact with the second structure 212. In this case, the first ground 111a and the second ground 112a may not be electrically connected to each other.

As another example, while the electronic device 100 is converted from the second state to the first state, the first structure 211 on the first ground 111a may be spaced apart from the third structure 213 on the second ground 112a, and thus may not be in electrical contact with the third structure 213. In this case, the first ground 111a and the second ground 112a may not be electrically connected to each other.

According to an embodiment, the electronic device 100 may include an additional contact structure 240. The additional contact structure 240 may include a first additional structure 241, a second additional structure 242, and/or a third additional structure 243. In an embodiment, the first additional structure 241 may be located at a point of the first ground 111a of the first housing 111. The second additional structure 242 and the third additional structure 243 may be located at a point of the second ground 112a of the second housing 112 to correspond to the position of the first structure 241.

According to an embodiment, when the electronic device 100 is in the first state or the second state, the first ground 111a of the first housing 111 and the second ground 112a of the second housing 112 may be electrically connected to each other via the additional contact structure 240. For example, when the electronic device 100 is in the first state, the first additional structure 241 on the first ground 111a and the second additional structure 242 on the second ground 112a may be in electrical contact with each other. In this case, the first ground 111a and the second ground 112a may be electrically connected to each other via the first additional structure 241 and the second additional structure 242. As another example, when the electronic device 100 is in the second state, the first additional structure 241 on the first ground 111a and the third additional structure 243 on the second ground 112a may be in electrical contact with each other. In this case, the first ground 111a and the second ground 112a may be electrically connected to each other via the first additional structure 241 and the third additional structure 243.

According to an embodiment, the additional contact structure 240 may be omitted. In this case, the first ground 111a and the second ground 112a may be electrically connected to each other via the contact structure 210.

According to an embodiment, the contact structure 210 may be omitted. In this case, the first ground 111a and the second ground 112a may be electrically connected to each other via the additional contact structure 240.

Figure 2B:
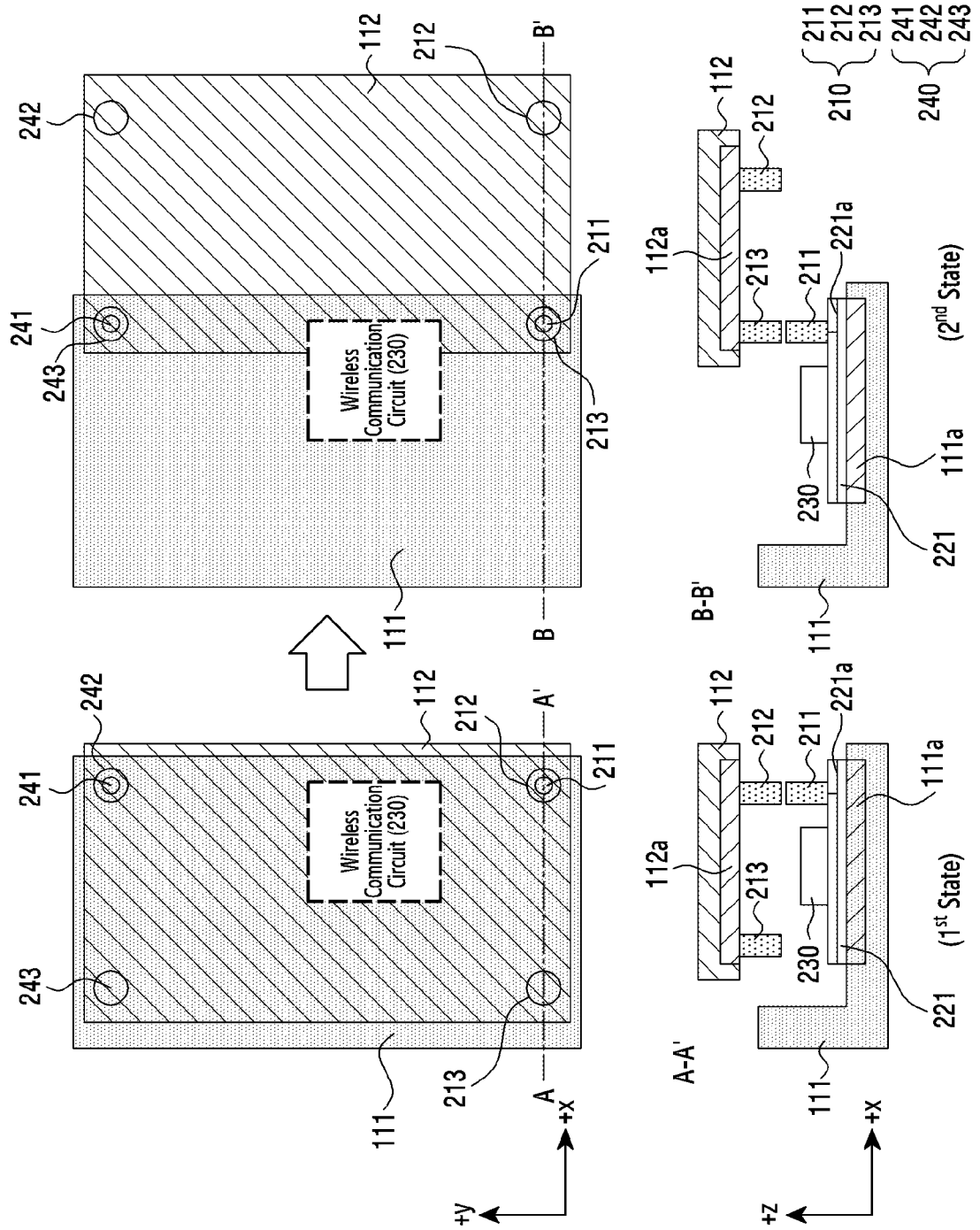
FIG. 2B is a diagram including sectional views illustrating an example contact structure for electrically connecting a third ground of a first printed circuit board and a second ground of a second housing to each other according to various embodiments.

FIG. 2B is a diagram including sectional views illustrating an example contact structure for electrically connecting a third ground of a first printed circuit board and a second ground of a second housing to each other according to various embodiments.

Referring to FIG. 2B, according to an embodiment, the electronic device 100 may include a first printed circuit board 221. In an embodiment, the first printed circuit board 221 may include a plurality of conductive layers, and at least one of the plurality of conductive layers may include a third ground 221a.

According to an embodiment, the first printed circuit board 221 may be a printed circuit board made of a material having a non-bendable property (e.g., FR4). According to an embodiment, the printed circuit board 221 may be a flexible printed circuit board (FPCB) having a bendable property (or a "flexible property"). According to an embodiment, a plurality of electronic components may be disposed on the first printed circuit board 221. For example, a processor (e.g., the processor 1020 in FIG. 10), a memory (e.g., the memory 1030 in FIG. 10), a control circuit, and/or an interface (e.g., the interface 1077 in FIG. 10) may be disposed on the first printed circuit board 221.

As another example, a wireless communication circuit 230 may be disposed on the first printed circuit board 221. The same reference numerals are used for the same or substantially the same components as those described above, and overlapping descriptions may not be repeated here.

The first structure 211 of the contact structure 210 according to an embodiment may be located at a first point of the first printed circuit board 221. The first structure 211 may be electrically connected to the third ground 221a of the first printed circuit board 221 at the first point.

In the first state, the second structure 212 according to an embodiment may be located at a second point of the second ground 112a of the second housing 112 at which the second structure 212 is capable of being in electrical contact with the first structure 211 on the first printed circuit board 221. In an embodiment, in the second state, the third structure 213 according to an embodiment may be located at a third point of the second ground 112a of the second housing 112 at which the third structure 212 is capable of being in electrical contact with the first structure 211 on the first printed circuit board 221.

According to an embodiment, when the electronic device 100 is in the first state or the second state, the contact structure 210 may electrically connect the third ground 221a of the first printed circuit board and the second ground 112a of the second housing 112 to each other. For example, in the first state, the first structure 211 and the second structure 212 may be in electrical contact with each other, and the third ground 221a and the second ground 112a may be electrically connected to each other via the first structure 211 and the second structure 212.

As another example, in the second state, the first structure 211 and the third structure 213 may be in electrical contact with each other, and the third ground 221a and the second ground 112a may be electrically connected to each other via the first structure 211 and the third structure 213.

In addition, the first ground 111a of the first housing 111 and the third ground 221a of the first printed circuit board 221 may also be in the state of being electrically connected to each other. Accordingly, all of the first ground 111a of the first housing 111, the second ground 112a of the second housing 112, and the third ground 221a of the first printed circuit board 221 may be electrically connected to each other via the contact structure 210.

According to an embodiment, the conductive portion of the first housing 111 to be described in greater detail below with reference to FIG. 2D may be in the state of being electrically connected to the first ground 111a, and as the conductive portion of the first housing 111 serving as an antenna radiator is electrically connected to the first ground 111a, the second ground 122a, and the third ground 221a, the ground of the antenna radiator may be extended. As another example, the conductive portion of the second housing 112 to be described in greater detail below with reference to FIG. 2E may be in the state of being electrically connected to the second ground 112a, and as the conductive portion of the second housing 112 serving as an antenna radiator is electrically connected to the second ground 112a, the third ground 221a, and the first ground 111a, the ground of the antenna radiator may be extended. Through extension of the ground, coupling occurring as the conductive portion of the first housing 111 and the conductive portion of the second housing 112 are adjacent to each other may be prevented or reduced.

According to an embodiment, the electronic device 100 may include an additional contact structure 240. The additional contact structure 240 may include a first additional structure 241, a second additional structure 242, and/or a third additional structure 243. According to an embodiment, the first additional structure 241 may be electrically connected to the third ground 221a. The second additional structure 242 may be electrically connected to the second ground 112a. The third additional structure 243 may be electrically connected to the second ground 112a.

According to an embodiment, when the electronic device 100 is in the first state or the second state, the additional contact structure 240 may electrically connect the third ground 221a and the second ground 112a to each other. For example, in the first state, the first additional structure 241 and the second additional structure 242 may be in electrical contact with each other, and the third ground 221a and the second ground 112a may be electrically connected to each other via the first additional structure 241 and the second additional structure 242. As another example, in the second state, the first additional structure 241 and the third additional structure 243 may be in electrical contact with each other, and the third ground 221a and the second ground 112a may be electrically connected to each other via the first additional structure 241 and the third additional structure 243.

According to an embodiment, the additional contact structure 240 may be omitted. In this case, the third ground 221a and the second ground 112a may be electrically connected to each other via the contact structure 210.

According to an embodiment, the contact structure 210 may be omitted. In this case, the third ground 221a and the second ground 112a may be electrically connected to each other via the additional contact structure 240.

Figure 2C:
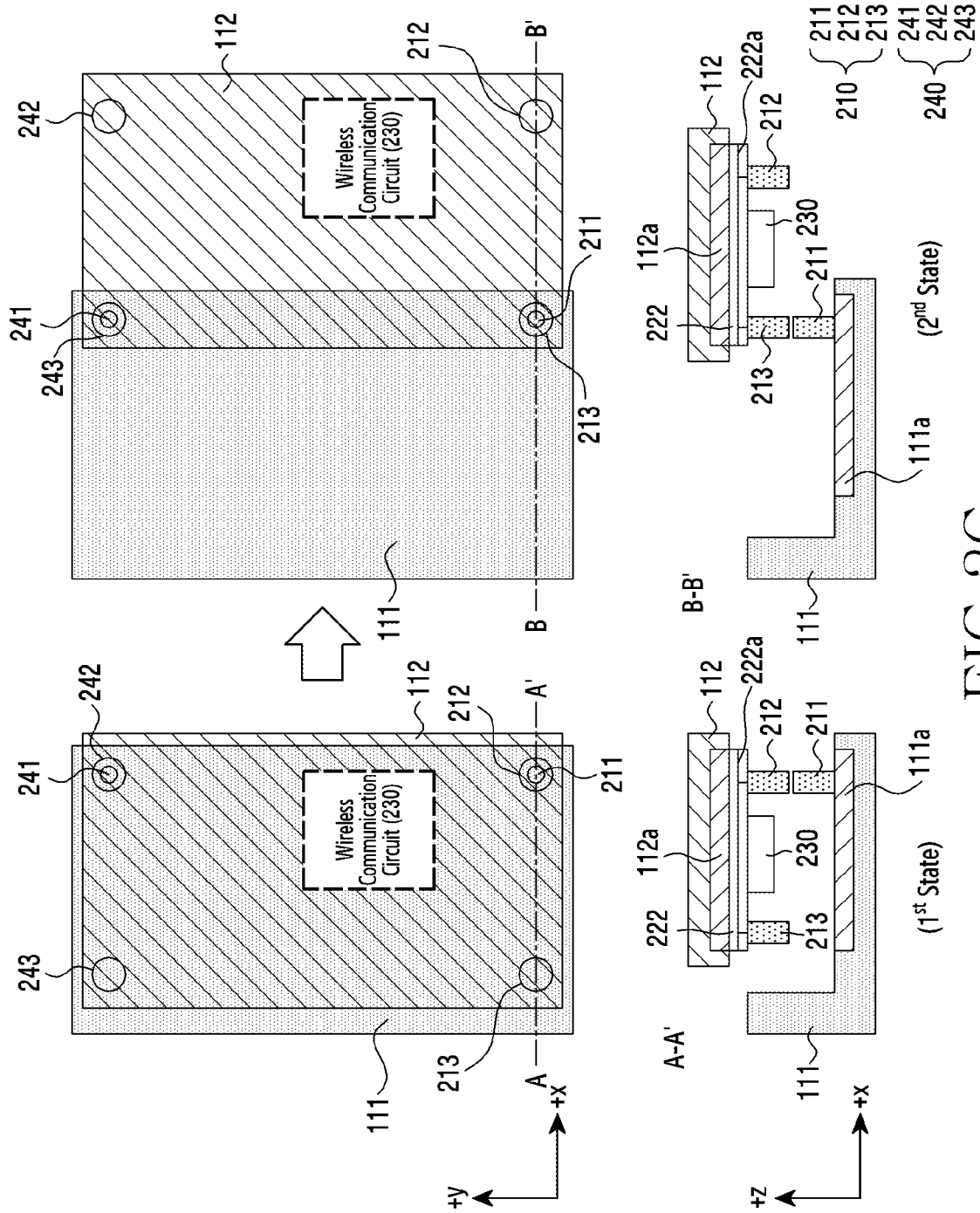
FIG. 2C is a diagram including sectional views illustrating an example contact structure for electrically connecting a fourth ground of a second printed circuit board and a first ground of a first housing to each other according to various embodiments.

FIG. 2C is a diagram including sectional views illustrating an example contact structure for electrically connecting a fourth ground of a second printed circuit board and a first ground of a first housing to each other according to various embodiments.

Referring to FIG. 2C, according to an embodiment, the electronic device 100 may include a second printed circuit board 222. In an embodiment, the second printed circuit board 222 may include a plurality of conductive layers, and at least one of the plurality of conductive layers may include a fourth ground 222a. In an embodiment, a wireless communication circuit 230 may be disposed on the second printed circuit board 222. The position and shape of the fourth ground 222a illustrated in FIG. 2C are only an example for convenience of description, and are not limited thereto.

The first structure 211 of the contact structure 210 according to an embodiment may be located at a first point of the first ground 111a of the first housing 111.

In the first state, the second structure 212 according to an embodiment may be located at the second point of the second printed circuit board 222 at which the second structure 212 is capable of being in electrical contact with the first structure 211. In an embodiment, the second structure 212 may be electrically connected to the fourth ground 222a of the second printed circuit board 222.

In an embodiment, in the second state, the third structure 213 according to an embodiment may be located at the third point of the second printed circuit board 222 at which the third structure 212 is capable of being in electrical contact with the first structure 211. In an embodiment, the third structure 213 may be electrically connected to the fourth ground 222a of the second printed circuit board 222.

According to an embodiment, when the electronic device 100 is in the first state or the second state, the contact structure 210 may electrically connect the fourth ground 222a of the second printed circuit board 222 and the first ground 111a of the first housing 111 to each other. For example, in the first state, the first structure 211 and the second structure 212 may be in electrical contact with each other. In this case, the fourth ground 222a and the first ground 111a may be electrically connected to each other via the first structure 211 and the second structure 212.

As another example, in the second state, the first structure 211 and the third structure 213 may be in electrical contact with each other. In this case, the fourth ground 222a and the first ground 111a may be electrically connected to each other via the first structure 211 and the third structure 213.

In addition, the second ground 112a of the second housing 112 and the fourth ground 222a of the second printed circuit board 222 may also be in the state of being electrically connected to each other. Accordingly, all of the first ground 111a of the first housing 111, the second ground 112a of the second housing 112, and the fourth ground 222a of the second printed circuit board 222 may be electrically connected to each other via the contact structure 210.

According to an embodiment, the conductive portion of the first housing 111 to be described in greater detail below with reference to FIG. 2D may be in the state of being electrically connected to the first ground 111a, and as the conductive portion of the first housing 111 serving as an antenna radiator is electrically connected to the first ground 111a, the second ground 112a, and the fourth ground 222a, the ground of the antenna radiator may be extended. As another example, the conductive portion of the second housing 112 to be described in greater detail below with reference to FIG. 2E may be in the state of being electrically connected to the second ground 112a, and as the conductive portion of the second housing 112 serving as an antenna radiator is electrically connected to the second ground 112a, the fourth ground 222a, and the first ground 111a, the ground of the antenna radiator may be extended. Through the extension of ground, coupling occurring as the conductive portion of the first housing 111 and the conductive portion of the second housing 112 are adjacent to each other may be prevented or reduced.

According to an embodiment, the electronic device 100 may include an additional contact structure 240. The additional contact structure 240 may include a first additional structure 241, a second additional structure 242, and/or a third additional structure 243. According to an embodiment, the first additional structure 241 may be electrically connected to the first ground 111a. The second additional structure 242 may be electrically connected to the fourth ground 222a. The third additional structure 243 may be electrically connected to the fourth ground 222a.

According to an embodiment, in the first state or the second state, the additional contact structure 240 may electrically connect the first ground 111a and the fourth ground 222a to each other. For example, in the first state, the first additional structure 241 and the second additional structure 242 may be in electrical contact with each other, and the first ground 111a and the fourth ground 222a may be electrically connected to each other via the first additional structure 241 and the second additional structure 242. As another example, in the second state, the first additional structure 241 and the third additional structure 243 may be in electrical contact with each other, and the first ground 111a and the fourth ground 222a may be electrically connected to each other via the first additional structure 241 and the third additional structure 243.

According to an embodiment, the additional contact structure 240 may be omitted. In this case, the first ground 111a and the fourth ground 222a may be electrically connected to each other via the contact structure 210.

According to an embodiment, the contact structure 210 may be omitted. In this case, the first ground 111a and the fourth ground 222a may be electrically connected to each other via the additional contact structure 240.

Figure 2D:
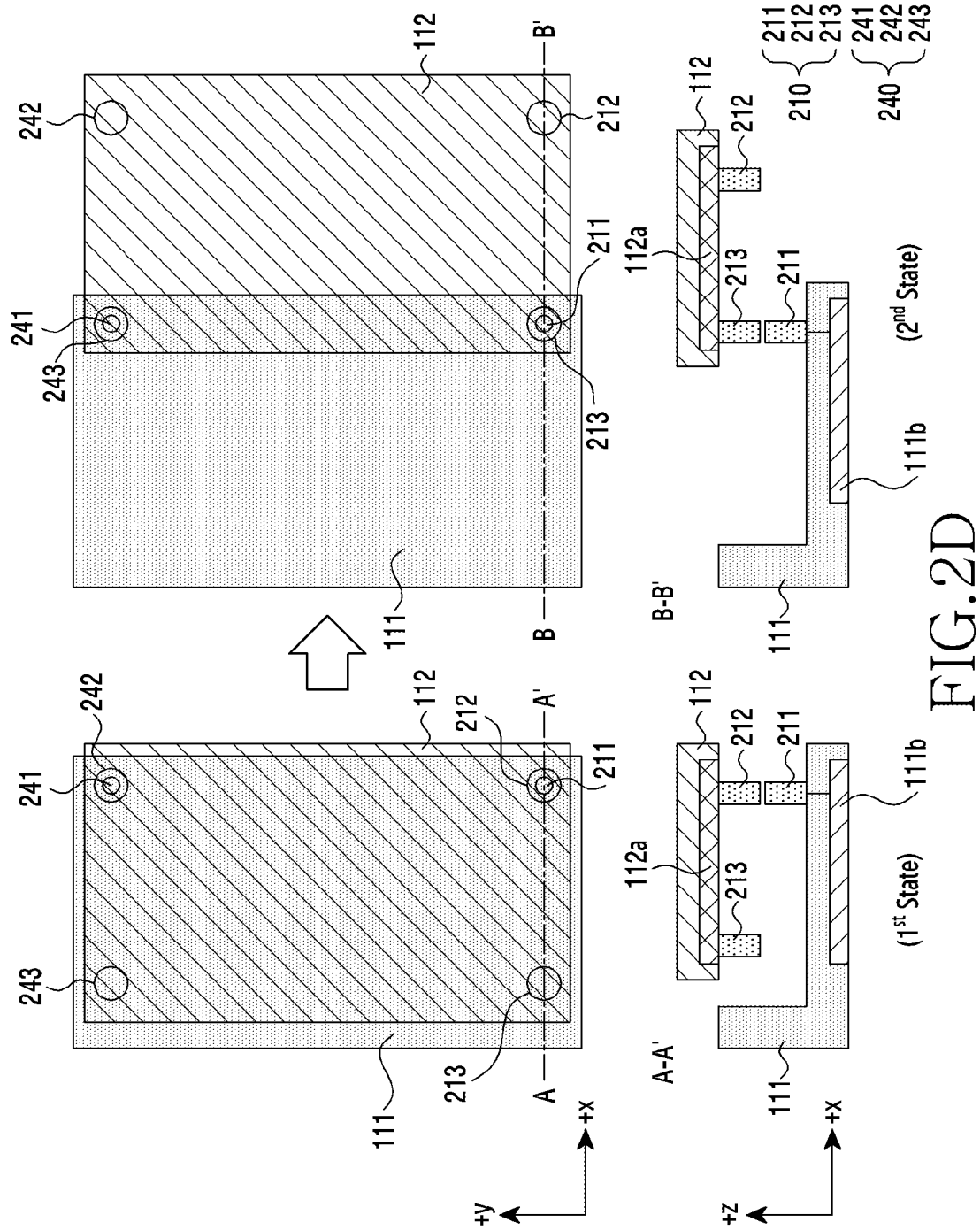
FIG. 2D is a diagram including sectional views illustrating an example contact structure for electrically connecting a second ground of a second housing and a first conductive portion of a first housing to each other according to various embodiments.

FIG. 2D is a diagram including sectional views illustrating an example contact structure for electrically connecting a second ground of a second housing and a first conductive portion of a first housing to each other according to various embodiments.

According to an embodiment, the first housing 111 may include a first conductive portion 111b, and the first conductive portion 111b may operate as an antenna radiator. The position and shape of the first conductive portion 11b illustrated in FIG. 2D are only an example for convenience of description, and are not limited thereto.

According to an embodiment, the first structure 211 may be electrically connected to the first conductive portion 111b, and the second structure 212 and the third structure 213 may be located at a point of a second ground 112a of the second housing 112 to correspond to the position of the first structure 211. For example, in the first state, the second structure 212 may be located at the first point of the second ground 112a of the second housing 112 at which the second structure 212 may be electrically connected to the first structure 211.

As another example, in the second state, the third structure 213 may be located at the second point of the second ground 112a of the second housing 112 at which the third structure 213 may be electrically connected to the first structure 211.

According to an embodiment, when the electronic device 100 is in the first state or the second state, the first conductive portion 111b and the second ground 112a may be electrically connected to each other via the contact structure 210. For example, when the electronic device 100 is in the first state, the first structure 211 electrically connected to the first conductive portion 111b and the second structure 212 on the second ground 112a may be in contact with each other. In this case, the first conductive portion 111b and the second ground 112a may be electrically connected to each other via the first structure 211 and the second structure 212.

As another example, when the electronic device 100 is in the second state, the first structure 211 electrically connected to the first conductive portion 111b and the third structure 213 on the second ground 112a may be in contact with each other. In this case, the first conductive portion 111b and the second ground 112a may be electrically connected to each other via the first structure 211 and the third structure 213.

According to an embodiment, as the first conductive portion 111b and the second ground 112a are electrically connected to each other, the electronic device 100 may prevent and/or reduce the first conductive portion 111b from being electromagnetically coupled to the conductive portion of the second housing 112 in the first state.

According to an embodiment, the additional contact structure 240 may include a first additional structure 241, a second additional structure 242, and/or a third additional structure 243. The first additional structure 241 may be electrically connected to the first conductive portion 111b, and the second additional structure 242 and the third additional structure 243 may be electrically connected to the second ground 112a. In an embodiment, in the first state, the first additional structure 241 and the second additional structure 242 may be electrically connected to each other, and in the second state, the first additional structure 241 and the third additional structure 243 may be electrically connected to each other. Accordingly, in the first state and the second state, the first conductive portion 111b may be electrically connected to the second ground 112a via the additional contact structure 240.

According to an embodiment, the additional contact structure 240 may be omitted, and in this case, the first conductive portion 111b and the second ground 112a may be electrically connected to each other via the contact structure 210. According to an embodiment, the contact structure 210 may be omitted, and in this case, the first conductive portion 111b and the second ground 112a may be electrically connected to each other via the additional contact structure 240.

Figure 2E:
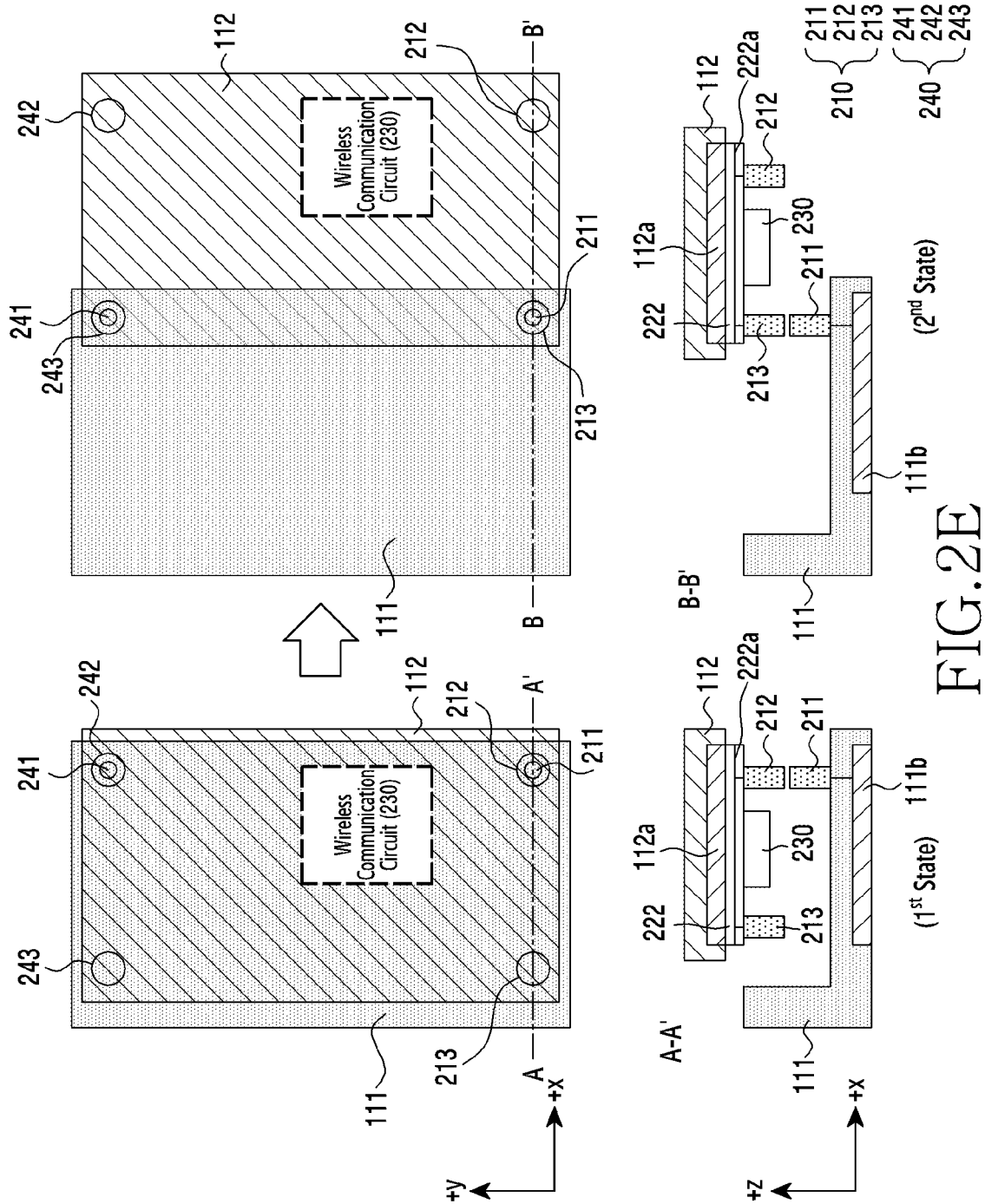
FIG. 2E is a diagram including sectional views illustrating an example contact structure for electrically connecting a first conductive portion of a first housing and a second ground of a second printed circuit board to each other according to various embodiments.

FIG. 2E is a diagram including sectional views illustrating an example contact structure for electrically connecting a first conductive portion of a first housing and a second ground of a second printed circuit board to each other according to various embodiments.

Referring to FIG. 2E, according to an embodiment, the first housing 111 may include a first conductive portion 111b, and the first conductive portion 111b may operate as an antenna radiator.

According to an embodiment, the first structure 211 may be electrically connected to the first conductive portion 111b, the second structure 212 may be located at the first point of the second printed circuit board 222, and the second structure 212 may be electrically connected to the fourth ground 222a of the second printed circuit board 222. The third structure 213 may be positioned at the second point of the second printed circuit board 222, and the third structure 213 may be electrically connected to the fourth ground 222a.

According to an embodiment, when the electronic device 100 is in the first state or the second state, the first conductive portion 111b and the fourth ground 112a may be electrically connected to each other via the contact structure 210. For example, when the electronic device 100 is in the first state, the first structure 211 electrically connected to the first conductive portion 111b and the second structure 212 may be in contact with each other. In this case, the first conductive portion 111b and the fourth ground 222a may be electrically connected to each other via the first structure 211 and the second structure 212. As another example, when the electronic device 100 is in the second state, the first structure 211 electrically connected to the first conductive portion 111b and the third structure 213 may be in contact with each other. In this case, the first conductive portion 111b and the fourth ground 222a may be electrically connected to each other via the first structure 211 and the third structure 213.

As another example, the fourth ground 222a and the second ground 112a may be in the state of being electrically connected to each other. Accordingly, the first conductive portion 111b may be electrically connected to the second ground 112a.

According to an embodiment, as the first conductive portion 111b and the fourth ground 222a are electrically connected to each other, it is possible to prevent or reduce the first conductive portion 111b from being electromagnetically coupled to the conductive portion of the second housing 112 in the first state.

According to an embodiment, the additional contact structure 240 may include a first additional structure 241, a second additional structure 242, and/or a third additional structure 243. The first additional structure 241 may be electrically connected to the first conductive portion 111b, and the second additional structure 242 and the third additional structure 243 may be electrically connected to the fourth ground 222a. In an embodiment, in the first state, the first additional structure 241 and the second additional structure 242 may be electrically connected to each other, and in the second state, the first additional structure 241 and the third additional structure 243 may be electrically connected to each other. Accordingly, in the first state and the second state, the first conductive portion 111b may be electrically connected to the fourth ground 222a via the additional contact structure 240.

According to an embodiment, the additional contact structure 240 may be omitted, and in this case, the first conductive portion 111b and the fourth ground 222a may be electrically connected to each other via the contact structure 210. According to an embodiment, the contact structure 210 may be omitted, and in this case, the first conductive portion 111b and the fourth ground 222a may be electrically connected to each other via the additional contact structure 240.

Figure 2F:
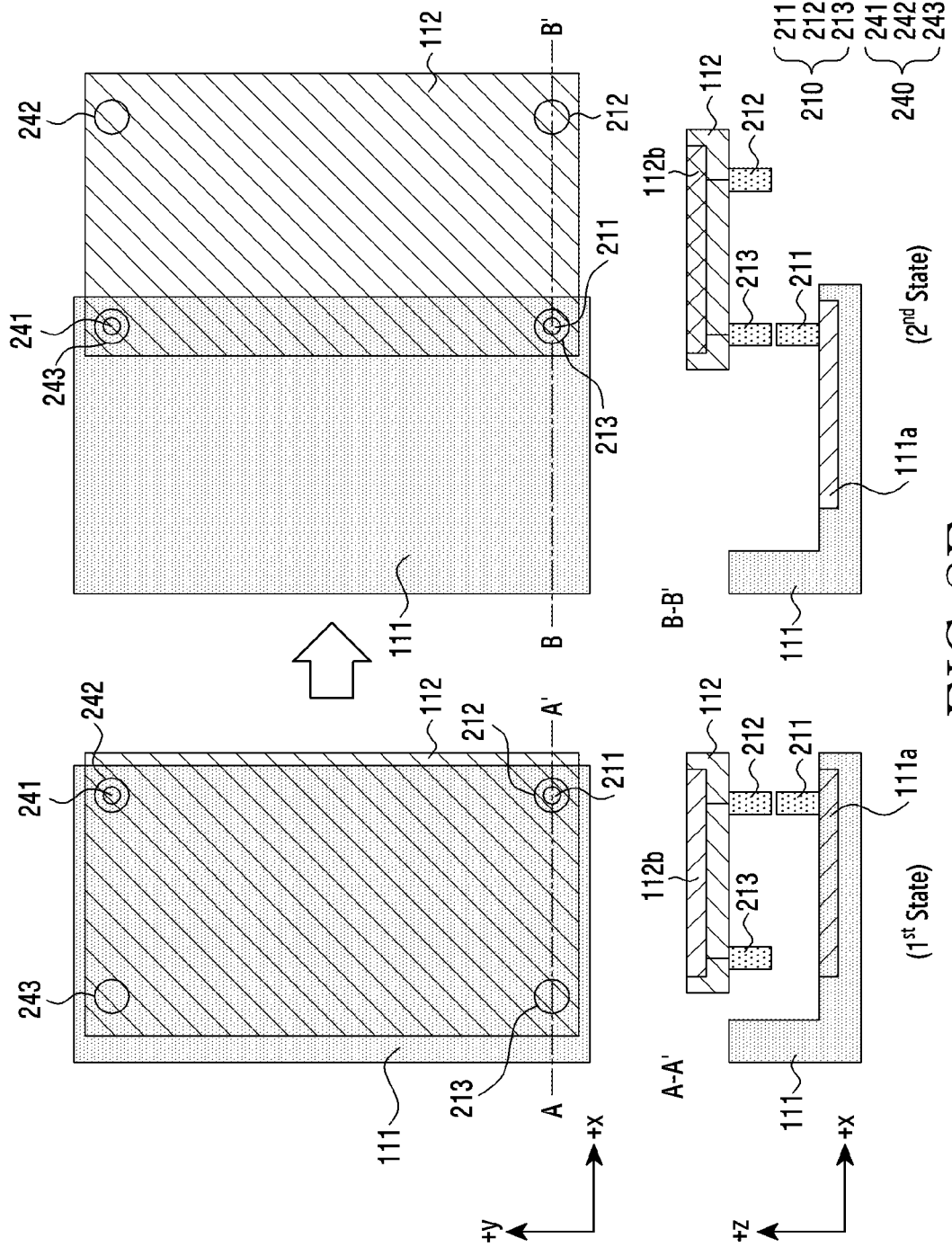
FIG. 2F is a diagram including sectional views illustrating an example contact structure for electrically connecting a second conductive portion of a second housing and a first ground of a first housing to each other according to various embodiments.

FIG. 2F is a diagram including sectional views illustrating an example contact structure for electrically connecting a second conductive portion of a second housing and a first ground of a first housing to each other according to various embodiments.

According to an embodiment, the second housing 112 may include a second conductive portion 112b, and the second conductive portion 112b may operate as an antenna radiator. The position and shape of the second conductive portion 112b illustrated in FIG. 2F are only an example for convenience of description, and are not limited thereto.

According to an embodiment, the first structure 211 may be located on the first ground 111a and electrically connected to the first ground 111a, and the second structure 212 and the third structure 213 may be located at a point of the second housing 112 to correspond to the position of the first structure 211. For example, in the first state, the second structure 212 may be located at the first point of the second housing 112 at which the second structure 212 may be electrically connected to the first structure 211. As another example, in the second state, the third structure 213 may be located at the second point of the second housing 112 at which the third structure 213 may be electrically connected to the first structure 211. In this case, the second structure 212 and the third structure 213 may be electrically connected to the second conductive portion 112b.

According to an embodiment, when the electronic device 100 is in the first state or the second state, the second conductive portion 112b and the first ground 111a may be electrically connected to each other via the contact structure 210. For example, when the electronic device 100 is in the first state, the second structure 212 electrically connected to the second conductive portion 112b and the first structure 211 on the first ground 111a may be in contact with each other. In this case, the second conductive portion 112b and the first ground 111a may be electrically connected to each other via the first structure 211 and the second structure 212.

As another example, when the electronic device 100 is in the second state, the third structure 213 electrically connected to the second conductive portion 112b and the first structure 211 on the first ground 111a may be in contact with each other. In this case, the second conductive portion 112b and the first ground 111a may be electrically connected to each other via the first structure 211 and the third structure 213.

According to an embodiment, as the second conductive portion 112b and the first ground 111a are electrically connected to each other, it is possible to prevent and/or reduce the second conductive portion 112b from being electromagnetically coupled to the conductive portion (e.g., the first conductive portion 111b) of the first housing 111 in the first state.

According to an embodiment, the additional contact structure 240 may include a first additional structure 241, a second additional structure 242, and/or a third additional structure 243. The first additional structure 241 may be electrically connected to the first ground 111a, and the second additional structure 242 and the third additional structure 243 may be electrically connected to the second conductive portion 112b. In an embodiment, in the first state, the first additional structure 241 and the second additional structure 242 may be electrically connected to each other, and in the second state, the first additional structure 241 and the third additional structure 243 may be electrically connected to each other. Accordingly, in the first state and the second state, the second conductive portion 112b may be electrically connected to the first ground 111a via the additional contact structure 240.

According to an embodiment, the additional contact structure 240 may be omitted, and in this case, the second conductive portion 112b and the first ground 111a may be electrically connected to each other via the contact structure 210. According to an embodiment, the contact structure 210 may be omitted, and in this case, the second conductive portion 112b and the first ground 111a may be electrically connected to each other via the additional contact structure 240.

Figure 2G:
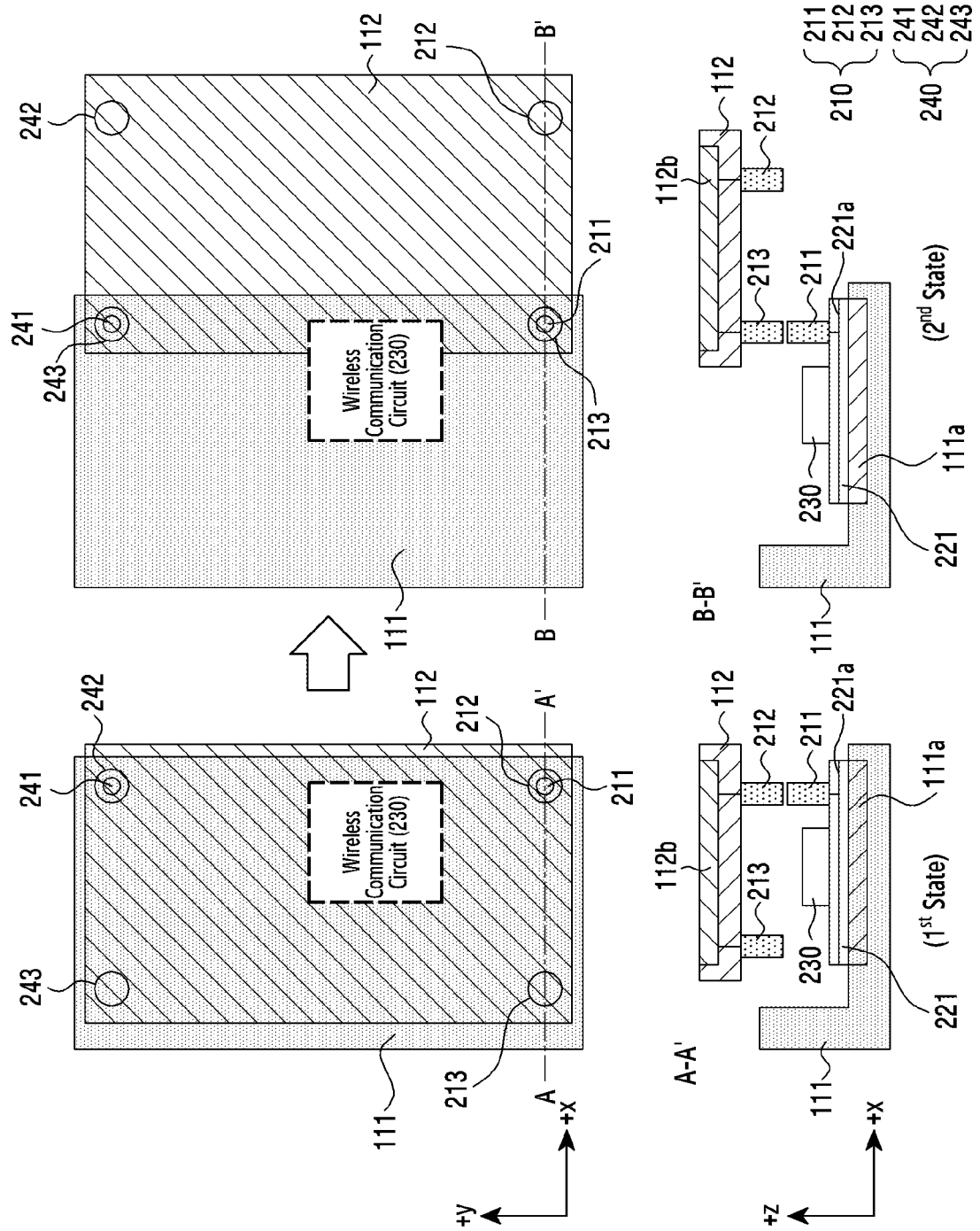
FIG. 2G is a diagram including sectional views illustrating an example contact structure for electrically connecting a second conductive portion of a second housing and a third ground of a first printed circuit board to each other according to various embodiments.

FIG. 2G is a diagram including sectional views illustrating an example contact structure for electrically connecting a second conductive portion of a second housing and a third ground of a first printed circuit board to each other according to various embodiments.

Referring to FIG. 2G, according to an embodiment, the second housing 112 may include a second conductive portion 112b, and the second conductive portion 112b may operate as an antenna radiator.

According to an embodiment, the first structure 211 may be disposed on the first printed circuit board 221 to be electrically connected to the third ground 221a, the second structure 212 may be located at the first point on the second housing 112, and the third structure 213 may be located at the second point on the second housing 112. In this case, the second structure 212 and the third structure 213 may be electrically connected to the second conductive portion 112b.

According to an embodiment, when the electronic device 100 is in the first state or the second state, the second conductive portion 112b and the third ground 221a may be electrically connected to each other via the contact structure 210. For example, when the electronic device 100 is in the first state, the second structure 212 electrically connected to the second conductive portion 112b and the first structure 211 may be electrically connected to each other. In this case, the second conductive portion 112b and the third ground 221a may be electrically connected to each other via the first structure 211 and the second structure 212. As another example, when the electronic device 100 is in the second state, the third structure 213 electrically connected to the second conductive portion 112b and the first structure 211 may be electrically connected to each other. In this case, the second conductive portion 112b and the third ground 221a may be electrically connected to each other via the first structure 211 and the third structure 213. As another example, the firth ground 111a and the third ground 221a may be in the state of being electrically connected to each other. Accordingly, the second conductive portion 112b may be electrically connected to the first ground 111a.

According to an embodiment, as the second conductive portion 112b and the third ground 221a are electrically connected to each other, it is possible to prevent and/or reduce the second conductive portion 112b from being electromagnetically coupled to the conductive portion (e.g., the first conductive portion 111b) of the first housing 111 in the first state.

According to an embodiment, the additional contact structure 240 may include a first additional structure 241, a second additional structure 242, and/or a third additional structure 243. The first additional structure 241 may be electrically connected to the third ground 221a, and the second additional structure 242 and the third additional structure 243 may be electrically connected to the second conductive portion 112b. In an embodiment, in the first state, the first additional structure 241 and the second additional structure 242 may be electrically connected to each other, and in the second state, the first additional structure 241 and the third additional structure 243 may be electrically connected to each other. Accordingly, in the first state and the second state, the second conductive portion 112b may be electrically connected to the third ground 221a via the additional contact structure 240.

According to an embodiment, the additional contact structure 240 may be omitted, and in this case, the second conductive portion 112b and the third ground 221a may be electrically connected to each other via the contact structure 210. According to an embodiment, the contact structure 210 may be omitted, and in this case, the second conductive portion 112b and the third ground 221a may be electrically connected to each other via the additional contact structure 240.

Figure 3A:
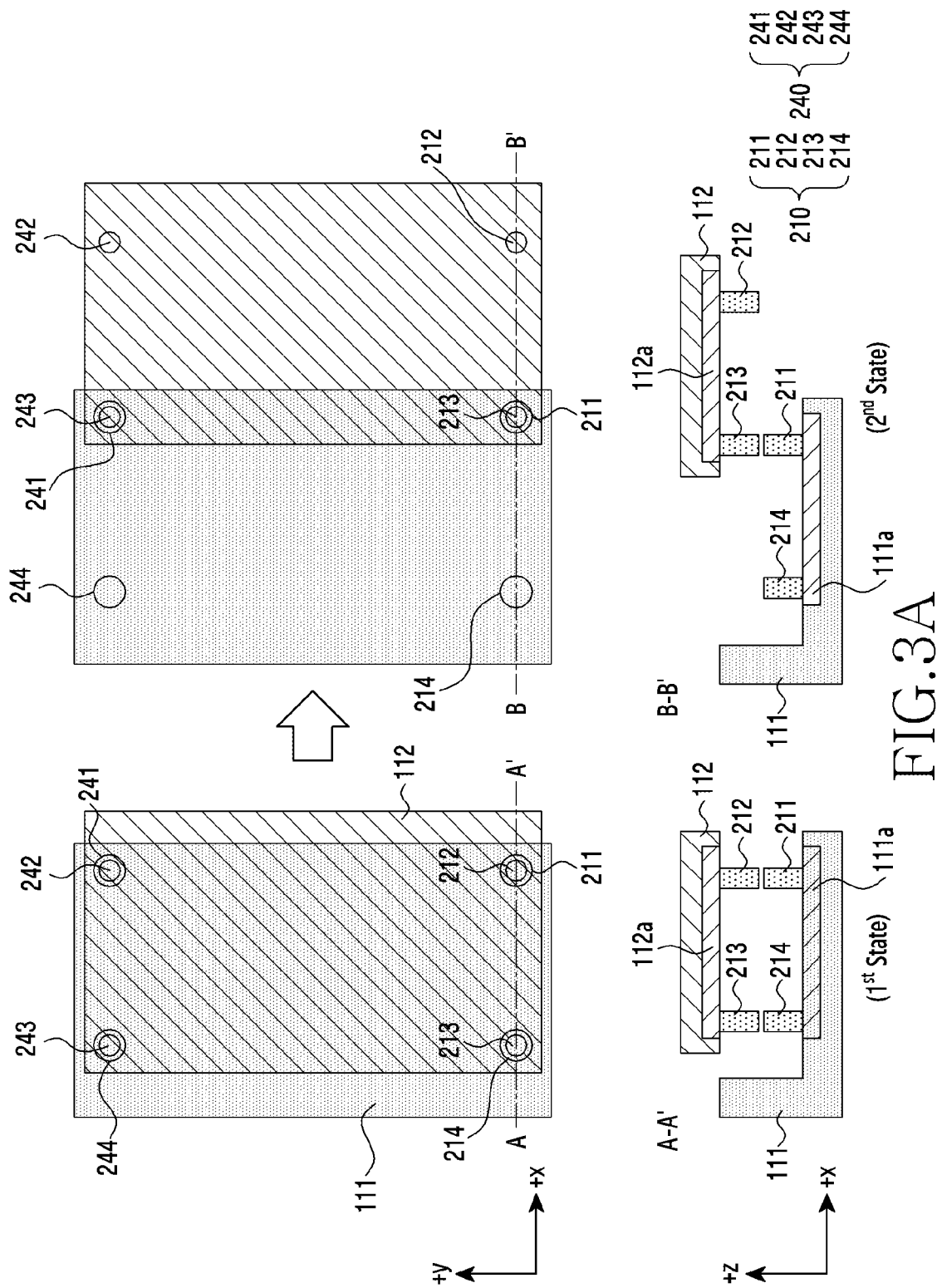
FIG. 3A is a diagram including sectional views illustrating an example in which among contact structures, a second structure and a third structure connected to a second housing are aligned in a horizontal direction (e.g., the x-axis direction) of an electronic device according to various embodiments.

FIG. 3A is a diagram including sectional views illustrating an example in which among contact structures, a second structure and a third structure connected to a second housing are aligned in a horizontal direction (e.g., the x-axis direction) of an electronic device according to various embodiments.

Referring to FIG. 3A, according to an embodiment, the electronic device 100 may include a contact structure 210. In an embodiment, the contact structure 210 may include a first structure 211, a second structure 212, a third structure 213, and a fourth structure 214. The same reference numerals are used for the same or substantially the same components as those described above, and overlapping descriptions may not be repeated here.

According to an embodiment, the second structure 212 and the third structure 213 may be located on the second ground 112a of the second housing 112 or may be electrically connected to the second ground 112a. For example, the second structure 212 may be located at a first point of the second ground 112a along a first axis parallel to the x axis. In an example, the third structure 213 may be located at a second point of the second ground 112a spaced apart from the first point by a predetermined distance along the first axis.

According to an embodiment, the first structure 211 may be located on the first ground 111a of the first housing 111 to correspond to the positions of the second structure 212 and the third structure 213 or may be electrically connected to the first ground 111a. At a point of the first ground 111a at which the first structure 211 is located, the first structure 211 may be in electrical contact with the second structure 212 in the first state and may be in electrical contact with the third structure 213 in the second state.

According to an embodiment, the fourth structure 214 may be located on the first ground 111a of the first housing 111 to correspond to the position of the third structure 213 or may be electrically connected to the first ground 1/1a. For example, in the first state, the fourth structure 214 may be located at a point of the first ground 111a at which the fourth structure 214 may be in electrical contact with the third structure 213.

According to an embodiment, when the electronic device 100 is in the first state or the second state, the first ground 111a of the first housing 111 and the second ground 112a of the second housing 112 may be electrically connected to each other. For example, when the electronic device 100 is in the first state, the first structure 211 may be in electrical contact with the second structure 212, and the third structure 213 may be in electrical contact with the fourth structure 214. In this case, the first ground 111a and the second ground 112a may be electrically connected to each other.

As another example, when the electronic device 100 is in the second state, the first structure 211 may be in electrical contact with the third structure 213. In this case, the first ground 111a and the second ground 112a may be electrically connected to each other via the first structure 211 and the third structure 213.

According to an embodiment, the additional contact structure 240 may include a first additional structure 241, a second additional structure 242, a third additional structure 243, and/or a fourth additional structure 244. The first additional structure 241 and the fourth additional structure 244 may be electrically connected to the first ground 111a, and the second additional structure 242 and the third additional structure 243 may be electrically connected to the second ground 112a. In an embodiment, in the first state, the first additional structure 241 may be electrically connected to the second additional structure 242, and in the second state, the third additional structure 243 may be electrically connected to the fourth additional structure 244. In the second state, the first additional structure 241 and the third additional structure 243 may be electrically connected to each other. Accordingly, in the first state and the second state, the first ground 111a may be electrically connected to the second ground 112a via the additional contact structure 240.

According to an embodiment, the additional contact structure 240 may be omitted, and in this case, the first ground 111a and the second ground 112a may be electrically connected to each other via the contact structure 210. According to an embodiment, the contact structure 210 may be omitted, and in this case, the first ground 111a and the second ground 112a may be electrically connected to each other via the additional contact structure 240.

Figure 3B:
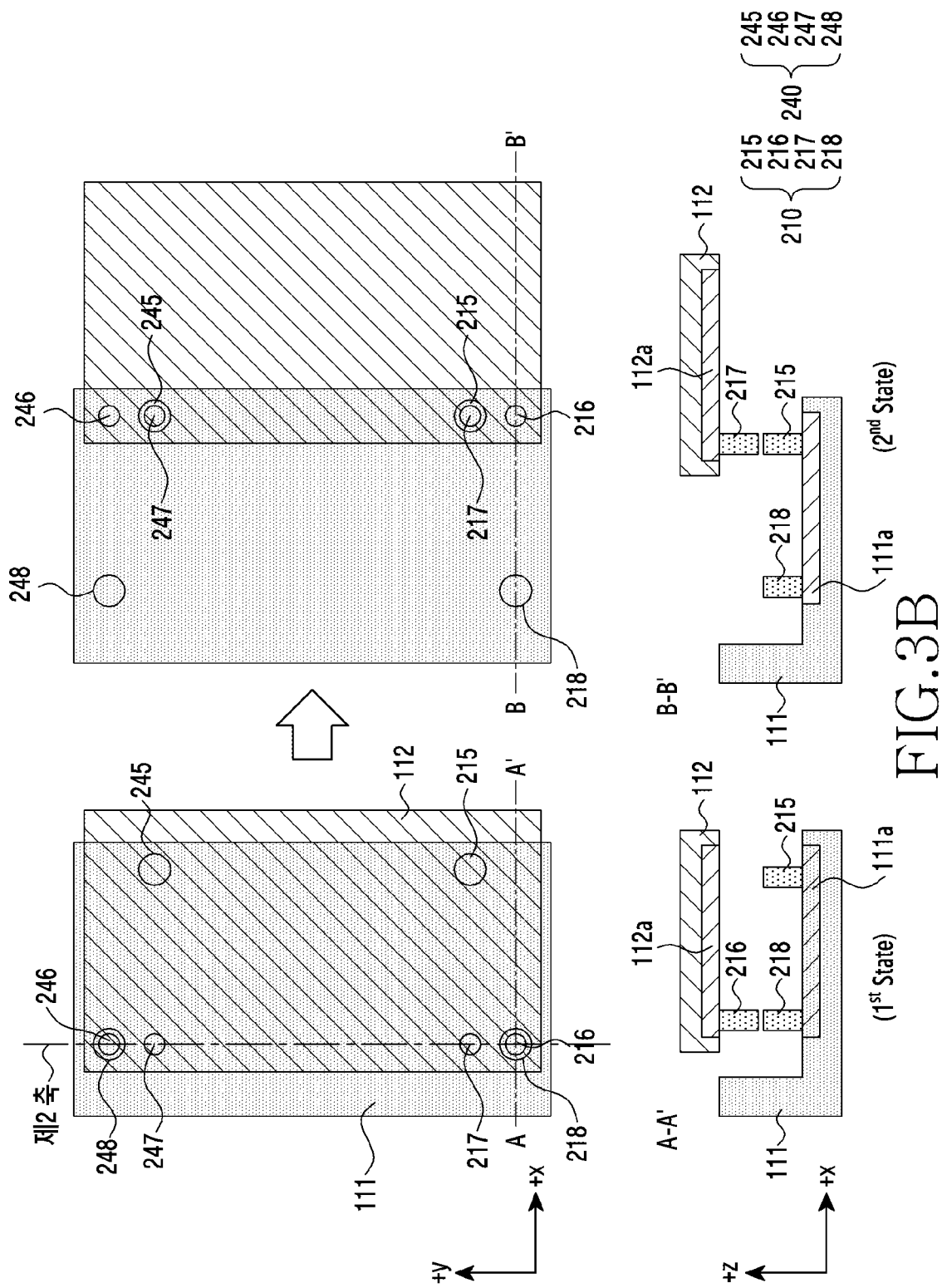
FIG. 3B is a diagram including sectional views illustrating an example in which among contact structures, a sixth structure and a seventh structure connected to a second housing are aligned in a vertical direction (e.g., the y-axis direction) of an electronic device according to various embodiments.

FIG. 3B is a diagram including sectional views illustrating an example in which among contact structures, a sixth structure and a seventh structure connected to a second housing are aligned in a vertical direction (e.g., the y-axis direction) of an electronic device according to various embodiments.

According to an embodiment, the sixth structure 216 and the seventh structure 217 may be located on the second ground 112a of the second housing 112 or may be electrically connected to the second ground 112a. For example, the sixth structure 216 may be located at a first point of the second ground 112a along a second axis substantially parallel to the y axis. In an example, the seventh structure 217 may be located at a second point of the second ground 112a spaced apart from the first point by a specified distance along the second axis substantially parallel to the y axis.

According to an embodiment, the fifth structure 215 may be located on the first ground 111a of the first housing 111 to correspond to the position of the seventh structure 217 or may be electrically connected to the first ground 111a. For example, in the second state, the first structure 311 may be located at a point of the first ground 111a at which the first structure 311 may be in electrical contact with the seventh structure 217.

According to an embodiment, the eighth structure 218 may be located on the first ground 111a of the first housing 111 to correspond to the position of the sixth structure 216 or may be electrically connected to the first ground 1/1a. For example, in the first state, the eighth structure 218 may be located at a point of the first ground 111a at which the eighth structure 214 may be in electrical contact with the sixth structure 216.

According to an embodiment, when the electronic device 100 is in the first state or the second state, the first ground 111a of the first housing 111 and the second ground 112a of the second housing 112 may be electrically connected to each other. As another example, when the electronic device 100 is in the first state, the sixth structure 216 may be in electrical contact with the eighth structure 218. In this case, the first ground 111a and the second ground 112a may be electrically connected to each other via the sixth structure 216 and the eighth structure 218. As another example, when the electronic device 100 is in the second state, the fifth structure 215 may be electrically connected to the seventh structure 217. In this case, the first ground 111a and the second ground 112a may be electrically connected to each other via the fifth structure 215 and the seventh structure 217.

According to an embodiment, the additional contact structure 240 may include a fifth additional structure 245, a sixth additional structure 246, a seventh additional structure 247, and/or an eighth additional structure 248. The fifth additional structure 245 and the eighth additional structure 248 may be electrically connected to the first ground 111a, and the sixth additional structure 246 and the seventh additional structure 247 may be electrically connected to the second ground 112a. In an embodiment, in the first state, the sixth additional structure 246 and the eighth additional structure 248 may be electrically connected to each other, and in the second state, the fifth additional structure 245 and the seventh additional structure 247 may be electrically connected to each other. Accordingly, in the first state and the second state, the first ground 111a may be electrically connected to the second ground 112a via the additional contact structure 240.

According to an embodiment, the additional contact structure 240 may be omitted, and in this case, the first ground 111a and the second ground 112a may be electrically connected to each other via the contact structure 210. According to an embodiment, the contact structure 210 may be omitted, and in this case, the first ground 111a and the second ground 112a may be electrically connected to each other via the additional contact structure 240.

Figure 3C:
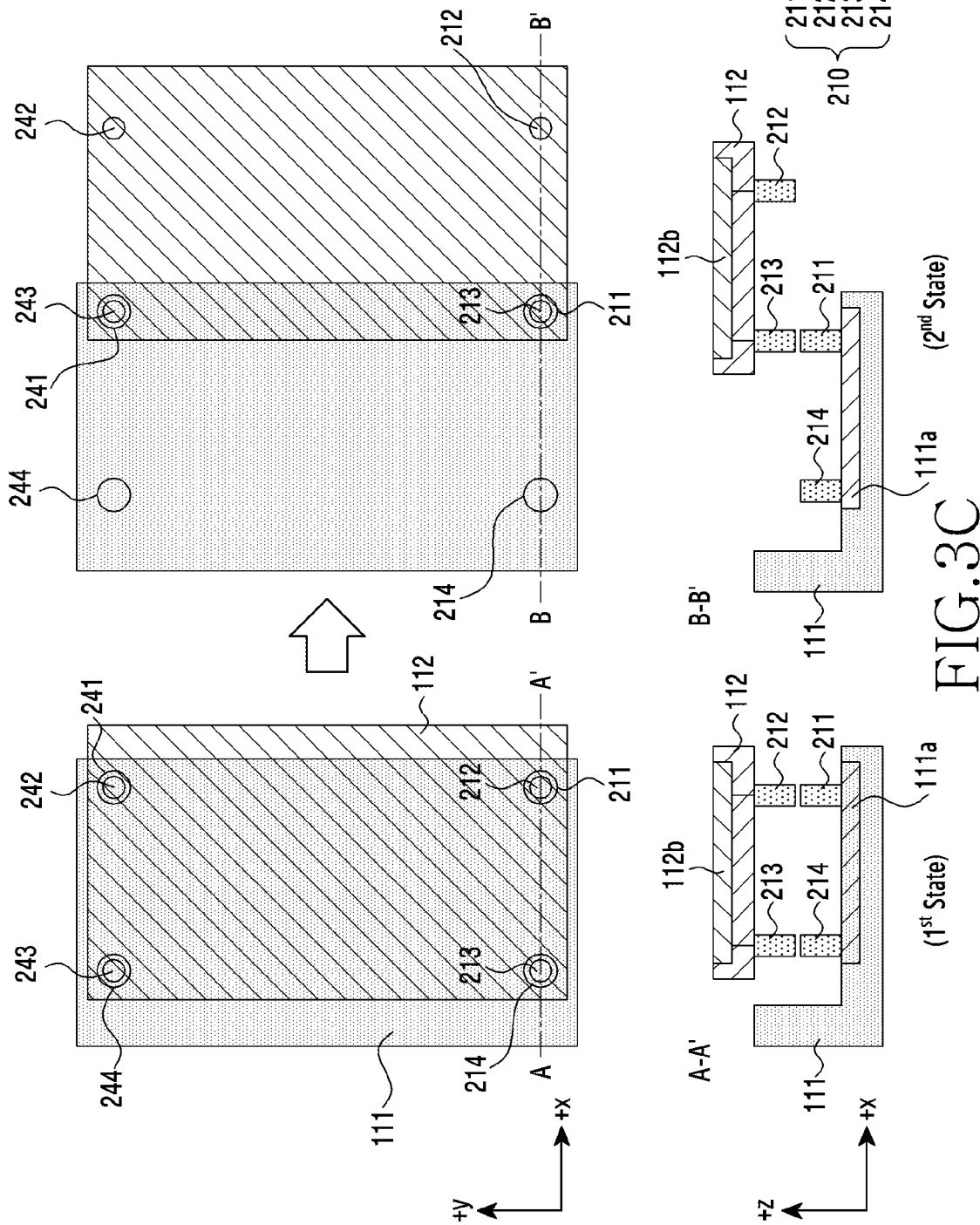
FIG. 3C is a diagram including sectional views illustrating a state in which a second conductive portion of the second housing is electrically connected to a first ground in the example of FIG. 3A according to various embodiments.

FIG. 3C is a diagram including sectional views illustrating a state in which a second conductive portion of the second housing is electrically connected to a first ground in the embodiment of FIG. 3A according to various embodiments.

Referring to FIG. 3C, according to an embodiment, the second housing 112 may include a second conductive portion 112b, and the second conductive portion 112b may operate as an antenna radiator.

According to an embodiment, the second structure 212 may be located at a first point on the second housing 112 along a first axis substantially parallel to the x axis. The third structure 213 may be located at a second point on the second housing 112 spaced apart from the first point by a predetermined distance along the first axis. In an embodiment, the second structure 212 and the third structure 213 may be electrically connected to the second conductive portion 112b.

According to an embodiment, the first structure 211 may be located on the first ground 111a to correspond to the positions of the second structure 212 and the third structure 213, and the first structure 211 may be electrically connected to the first ground 111a. The first structure 211 may be in electrical contact with the second structure 212 in the first state and may be electrically connected to the third structure 213 in the second state.

According to an embodiment, the fourth structure 214 may be located on the first ground 111a to correspond to the position of the third structure 213 or may be electrically connected to the first ground 111a, and the fourth structure 214 may be electrically connected to the first ground. For example, in the first state, the fourth structure 214 may be located at a point on the first ground 111a at which the fourth structure 214 may be electrically connected to the third structure 213.

According to an embodiment, when the electronic device 100 is in the first state or the second state, the first ground 111a and the second conductive portion 112b may be electrically connected to each other. For example, when the electronic device 100 is in the first state, the first structure 211 may be electrically connected to the second structure 212, and the third structure 213 may be electrically connected to the fourth structure 214. In this case, the first ground 111a and the second conductive portion 112b may be electrically connected to each other.

As another example, when the electronic device 100 is in the second state, the first structure 211 may be electrically connected to the third structure 213. In this case, the first ground 111a and the second conductive portion 112b may be electrically connected to each other via the first structure 211 and the third structure 213.

According to an embodiment, the additional contact structure 240 may include a first additional structure 241, a second additional structure 242, a third additional structure 243, and/or a fourth additional structure 244. The first additional structure 241 and the fourth additional structure 244 may be electrically connected to the first ground 111a, and the second additional structure 242 and the third additional structure 243 may be electrically connected to the second conductive portion 112b. In an embodiment, in the first state, the first additional structure 241 may be electrically connected to the second additional structure 242, and the third additional structure 243 may be electrically connected to the fourth additional structure 244. In the second state, the first additional structure 241 and the third additional structure 243 may be in electrical contact with each other. Accordingly, in the first state and the second state, the first ground 111a may be electrically connected to the second conductive portion 112b via the additional contact structure 240.

According to an embodiment, the additional contact structure 240 may be omitted, and in this case, the first ground 111a and the second conductive portion 112b may be electrically connected to each other via the contact structure 210. According to an embodiment, the contact structure 210 may be omitted, and in this case, the first ground 111a and the second conductive portion 112b may be electrically connected to each other via the additional contact structure 240.

According to an embodiment, the second structure 212 and the third structure 213 may be electrically connected to a second ground (e.g., the second ground 112a in FIG. 2D). The first structure 211 and the fourth structure 214 may be electrically connected to a first conductive portion (e.g., the first conductive portion 111b in FIG. 2D) of the first housing 111. When the electronic device 100 is in the first state, the first structure 211 may be electrically connected to the second structure 212, and the third structure 213 may be electrically connected to the fourth structure 214. Accordingly, the first conductive portion 111b and the second ground 112a may be electrically connected to each other. In addition, when the electronic device 100 is in the second state, the first structure 211 may be electrically connected to the third structure 213, and accordingly, the first conductive portion 111b and the second ground 112a may be electrically connected to each other.

Figure 3D:
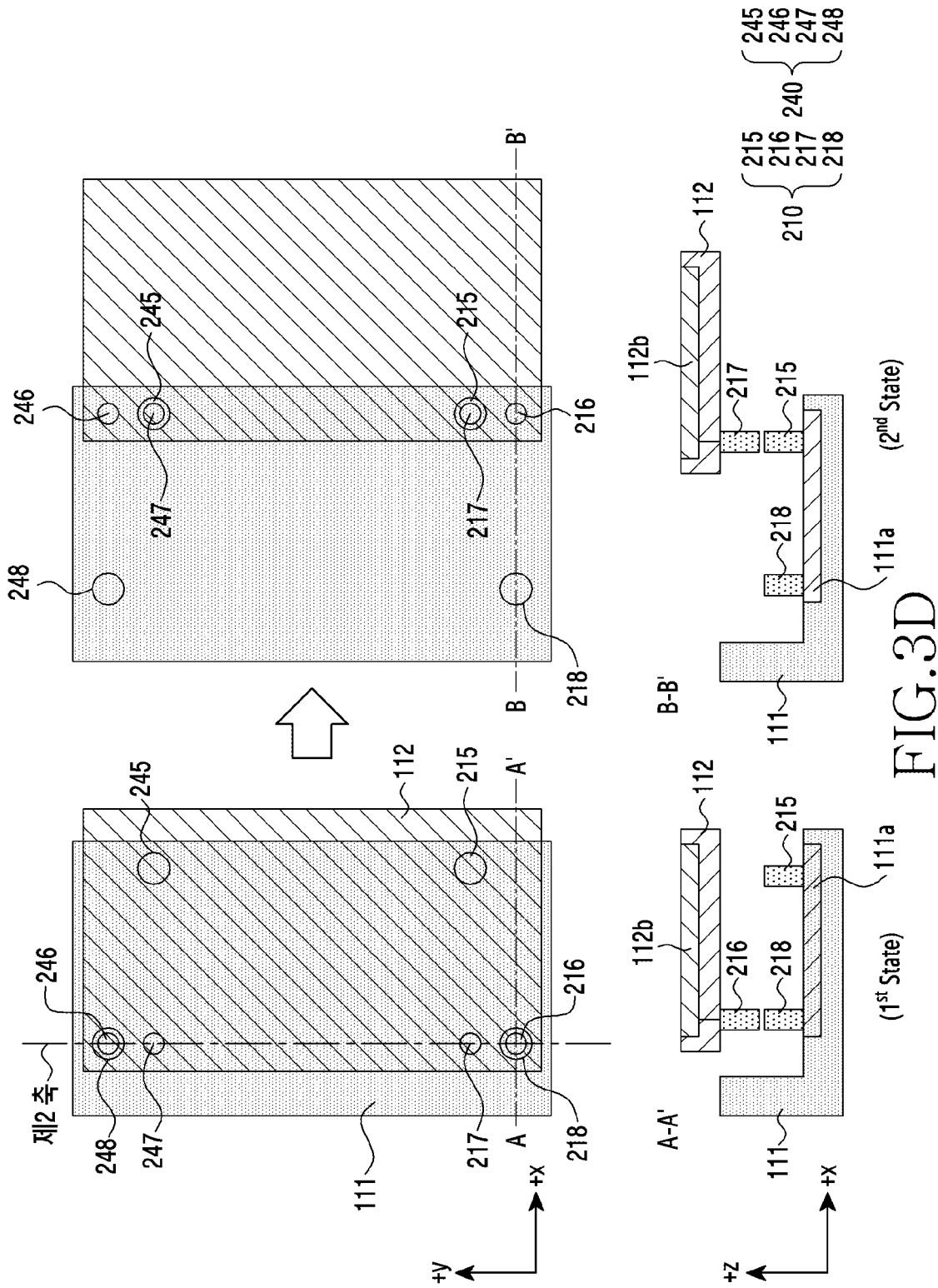
FIG. 3D is a diagram including sectional views illustrating a state in which a second conductive portion of the second housing is electrically connected to a first ground in the example of FIG. 3B according to various embodiments.

FIG. 3D is a diagram including sectional views illustrating a state in which a second conductive portion of the second housing is electrically connected to a first ground in the example of FIG. 3B according to various embodiments.

According to an embodiment, the sixth structure 216 and the seventh structure 217 may be located on the second housing 112. For example, the sixth structure 216 may be located at a first point of the second ground 112a along a second axis substantially parallel to the y axis. In an example, the seventh structure 217 may be located at a second point of the second housing 112 spaced apart from the first point by a predetermined distance along the second axis substantially parallel to the y axis. In an embodiment, the sixth structure 216 and the seventh structure 217 may be electrically connected to the second conductive portion 112b.

According to an embodiment, the fifth structure 215 may be located on the first ground 111a to correspond to the position of the seventh structure 217. For example, in the second state, the fifth structure 215 may be located at a point on the first ground 111a at which the fifth structure 215 may be electrically connected to the seventh structure 217. The fifth structure 215 may be electrically connected to the first ground 111a.

According to an embodiment, the eighth structure 218 may be located on the first ground 111a to correspond to the position of the sixth structure 216. For example, in the first state, the eighth structure 218 may be located at a point on the first ground 111a at which the eighth structure 214 may be electrically connected to the sixth structure 216. The sixth structure 216 may be electrically connected to the first ground 111a.

According to an embodiment, when the electronic device 100 is in the first state or the second state, the first ground 111a and the second conductive portion 112b may be electrically connected to each other. As another example, when the electronic device 100 is in the first state, the sixth structure 216 may be in electrical contact with the eighth structure 218. In this case, the first ground 111a and the second conductive portion 112b may be electrically connected to each other via the sixth structure 216 and the eighth structure 218. As another example, when the electronic device 100 is in the second state, the fifth structure 215 may be electrically connected to the seventh structure 217. In this case, the first ground 111a and the second conductive portion 112b may be electrically connected to each other via the fifth structure 215 and the seventh structure 217.

According to an embodiment, the additional contact structure 240 may include a fifth additional structure 245, a sixth additional structure 246, a seventh additional structure 247, and/or an eighth additional structure 248. The fifth additional structure 245 and the eighth additional structure 248 may be electrically connected to the first ground 111a, and the sixth additional structure 246 and the seventh additional structure 247 may be electrically connected to the second conductive portion 112b. In an embodiment, in the first state, the sixth additional structure 246 and the eighth additional structure 248 may be electrically connected to each other, and in the second state, the fifth additional structure 245 and the seventh additional structure 247 may be electrically connected to each other. Accordingly, in the first state and the second state, the first ground 111a may be electrically connected to the second conductive portion 112b via the additional contact structure 240.

According to an embodiment, the additional contact structure 240 may be omitted, and in this case, the first ground 111a and the second conductive portion 112b may be electrically connected to each other via the contact structure 210. According to an embodiment, the contact structure 210 may be omitted, and in this case, the first ground 111a and the second conductive portion 112b may be electrically connected to each other via the additional contact structure 240.

According to an embodiment, the fifth structure 215 and the eighth structure 218 may be electrically connected to a first conductive portion (e.g., the first conductive portion 111b in FIG. 2D) of the first housing 111. The sixth structure 216 and the seventh structure 217 may be electrically connected to a second ground (e.g., the second ground 112a in FIG. 2D) of the second housing 112. When the electronic device 100 is in the first state, the sixth structure 216 may be electrically connected to the eighth structure 218, and accordingly, the first conductive portion 111b and the second ground 112a may be electrically connected to each other. In addition, when the electronic device 100 is in the second state, the fifth structure 215 may be electrically connected to the seventh structure 217, and accordingly, the first conductive portion 111b and the second ground 112a may be electrically connected to each other.

Figure 4A:
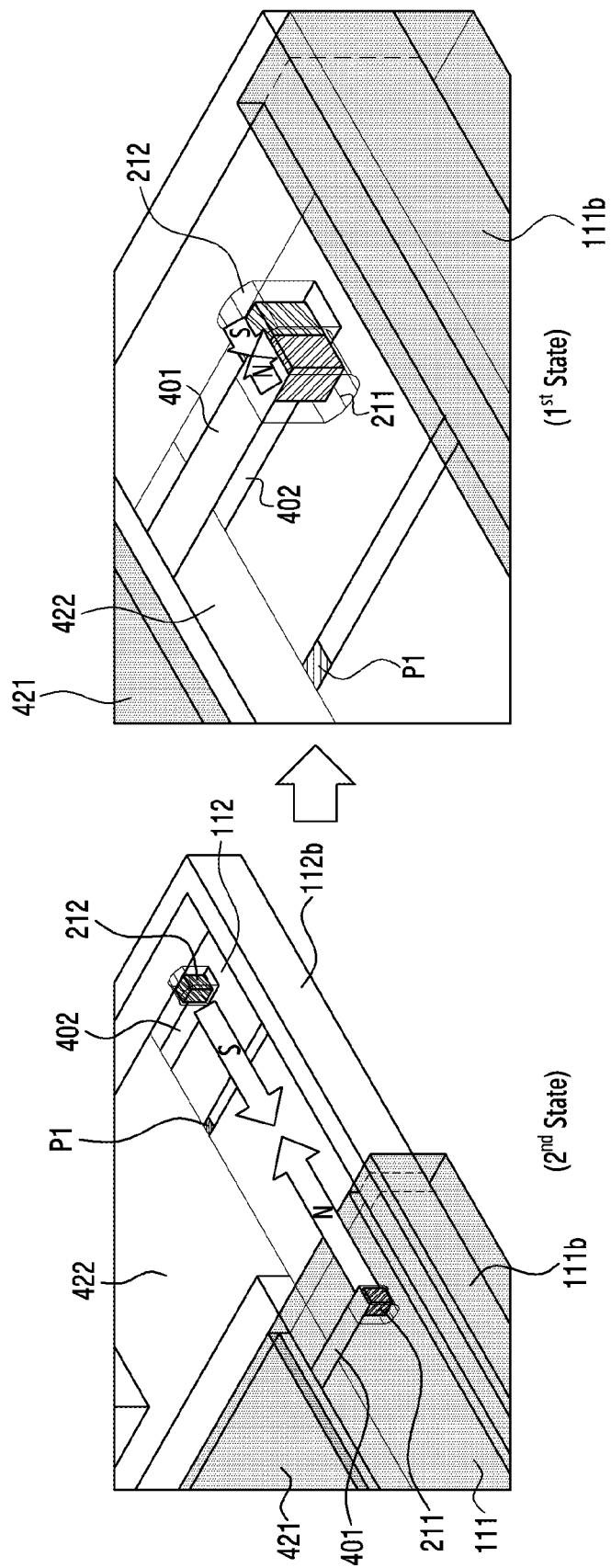
FIG. 4A is a perspective view illustrating a first structure disposed in a first housing and a second structure disposed in a second housing according to a change in state of the electronic device according to various embodiments.

FIG. 4A is a perspective view illustrating a first structure disposed in a first housing and a second structure disposed in a second housing according to a change in state of the electronic device according to various embodiments.

Referring to FIG. 4A, according to an embodiment, the first housing 111 may include a first conductive portion 111b that forms a portion of a side surface of the electronic device 100. The second housing 112 may include a second conductive portion 112b that forms a portion of a side surface of the electronic device 100. In an embodiment, the first conductive portion 111b and the second conductive portion 112b may operate as antenna radiators.

According to an embodiment, as being converted from the second state to the first state, the second housing 112 may be entered into the first housing 111.

According to an embodiment, the electronic device 100 may include a first conductive member 421 and/or a second conductive structure 422. At least a portion of the first conductive structure 421 and/or at least a portion of the second conductive structure 422 may include a ground.

According to an embodiment, the first structure 211 may be electrically connected to the first conductive structure 421 via a first conductive connection member 401. As another example, the second structure 212 may be electrically connected to the second conductive structure 422 via a second conductive connection member 402.

According to an embodiment, the second conductive portion 112b may be in the state of being electrically connected to the second conductive structure 422. As the first structure 211 and the second structure 212 are electrically connected to each other in the first state, the first conductive structure 421 and the second conductive structure 422 may be electrically connected to each other, and as a result, the second conductive portion 112b may be electrically connected to a ground of the first conductive structure 421 and a ground of the second conductive structure 422. As the ground connected to the second conductive part 112b extends, the electronic device 100 may prevent and/or reduce the second conductive portion 112b from being coupled to the first conductive portion 111b.

As another example, the first conductive portion 111b may be in the state of being connected to the first conductive structure 421. As the first structure 211 and the second structure 212 are electrically connected to each other in the first state, the first conductive structure 421 and the second conductive structure 422 may be electrically connected to each other, and as a result, the first conductive portion 111b may be electrically connected to the ground of the first conductive structure 421 and the ground of the second conductive structure 422. As the ground connected to the first conductive part 111b extends, the electronic device 100 may prevent and/or reduce the first conductive portion 111b from being coupled to the second conductive portion 112b.

According to an embodiment, the first conductive structure 421 may be replaced with a first printed circuit board (e.g., the first printed circuit board 221 in FIG. 2B). In this case, the ground of the first conductive structure 421 may refer, for example, to the third ground 221a of the first printed circuit board 221. According to an embodiment, the second conductive structure 422 may be replaced with a second printed circuit board (e.g., the second printed circuit board 222 in FIG. 2C). In this case, the ground of the second conductive structure 422 may refer, for example, to the fourth ground 222a of the second printed circuit board 222.

According to an embodiment, the first conductive structure 421 may be integrated with the first conductive portion 111b. The first conductive structure 421 integrated with the first conductive portion 111b may be electrically connected to the second conductive structure 422 including a ground. Accordingly, the first conductive portion 111b serving as an antenna radiator may be electrically connected to the ground of the second conductive structure 422 via the first conductive structure 421, and the electronic device 100 may prevent and/or reduce the first conductive portion 111b from being coupled to the second conductive portion 112b. According to an embodiment, the second conductive structure 422 may be integrated with the second conductive portion 112b. The second conductive structure 422 integrated with the second conductive portion 112b may be electrically connected to the first conductive structure 421 including a ground. Accordingly, the second conductive portion 112b serving as an antenna radiator may be electrically connected to the ground of the first conductive structure 421 via the second conductive structure 422, and the electronic device 100 may prevent and/or reduce the second conductive portion 112b from being coupled to the first conductive portion 111b.

According to an embodiment, the first structure 211 may include a first magnet therein, and the second structure 212 may include a second magnet therein. The first magnet of the first structure 211 and the second magnet of the second structure 212 may have opposite magnetic properties. For example, when the first magnet has a magnetic property of an N pole, the second magnet may have a magnetic property of an S pole opposite to the N pole of the first magnet.

According to an embodiment, while the electronic device 100 is converted from the second state to the first state, the second structure 212 may move toward the first structure 211, and in the first state, the first structure 211 and the second structure 212 may be electrically connected to each other.

According to an embodiment, in the first state, the first structure 211 and the second structure 212 may be electromagnetically connected by coupling in the state of being spaced apart from each other by a predetermined distance. In an example, the coupling method may refer to a phenomenon in which AC signal energy is electromagnetically transmitted between independent spaces or lines.

According to an embodiment, in the second state in which the wireless communication circuit 230 is disposed on the first printed circuit board 221 or the second printed circuit board 222, the wireless communication circuit 230 may transmit and receive an RF signal of a predetermined frequency band by feeding power to the second conductive portion at a first point P1. In the first state, the wireless communication circuit 230 may transmit and receive an RF signal of a predetermined frequency band by feeding power to the first conductive portion 111b at the first point P1.

Figure 4B:
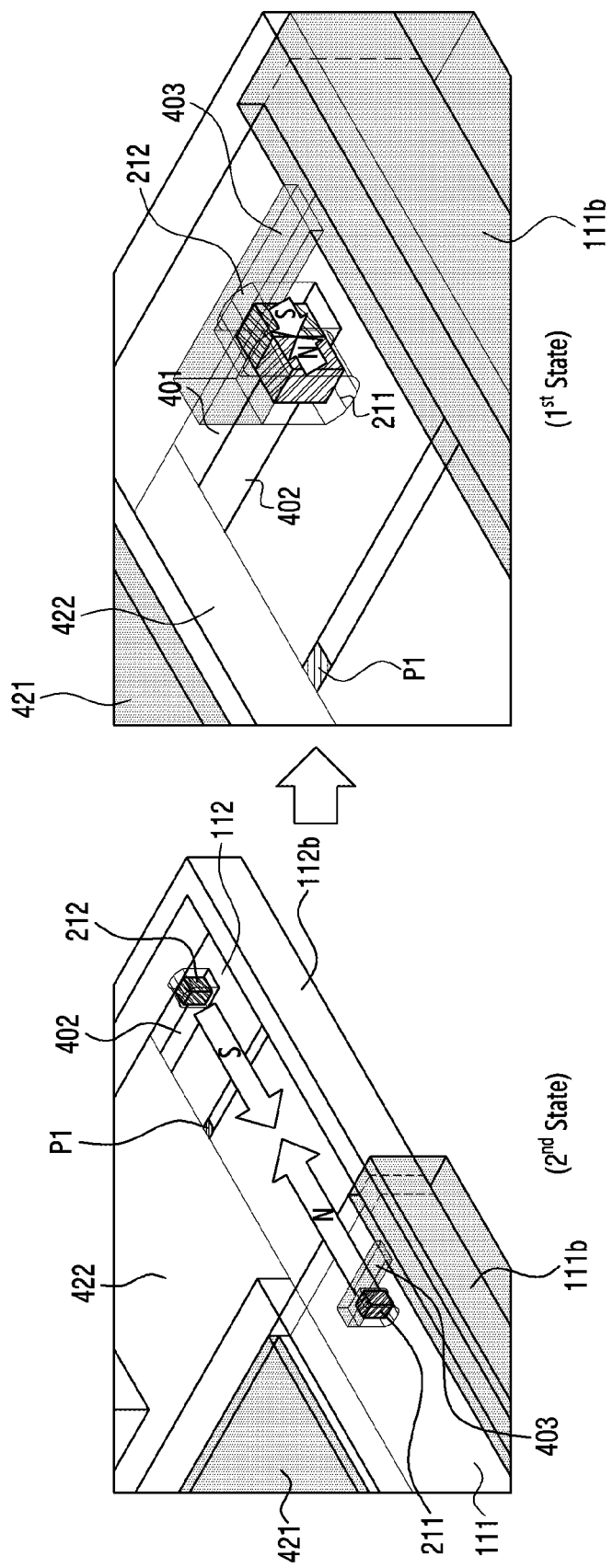
FIG. 4B is a perspective view illustrating the first structure connected to a first conductive portion and the second structure connected to a second conductive structure according to a change in state of the electronic device according to various embodiments.

FIG. 4B is a perspective view illustrating the first structure connected to a first conductive portion and the second structure connected to a second conductive structure according to a change in state of the electronic device according to various embodiments.

According to an embodiment, the first structure 211 may be electrically connected to the first conductive connection member 111b via a third conductive connection member 403. As the first structure 211 and the second structure 212 is in contact with each other in the first state, the ground of the second conductive structure 422 may be electrically connected to the first conductive portion 111b. As the first conductive portion 111b serving as an antenna radiator is electrically connected to the ground of the second conductive structure 422, the electronic device 100 may prevent and/or reduce the first conductive portion 111b from being coupled to the second conductive portion 112b.

Figure 4C:
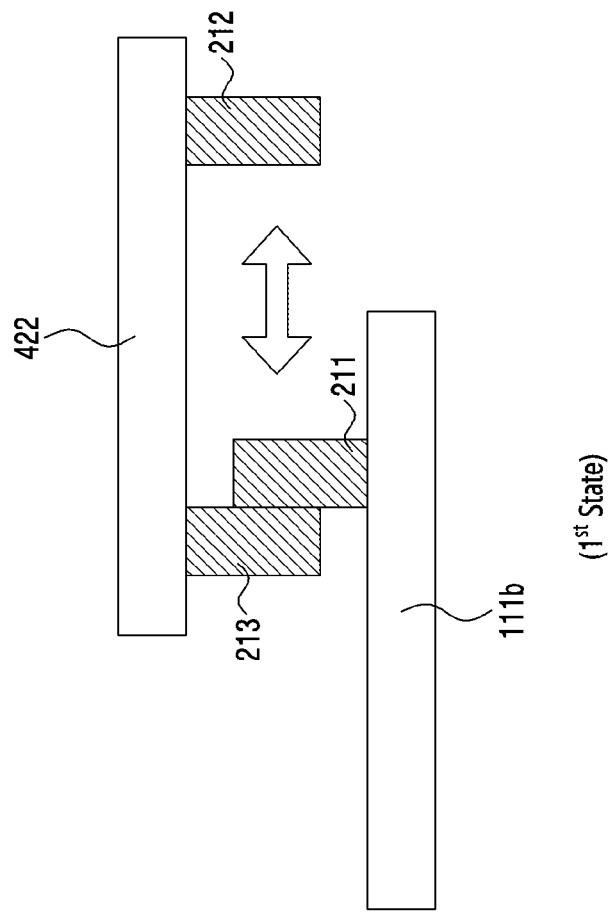
FIG. 4C is a diagram further illustrating a third structure of FIG. 4B according to various embodiments.
Figure 4C:
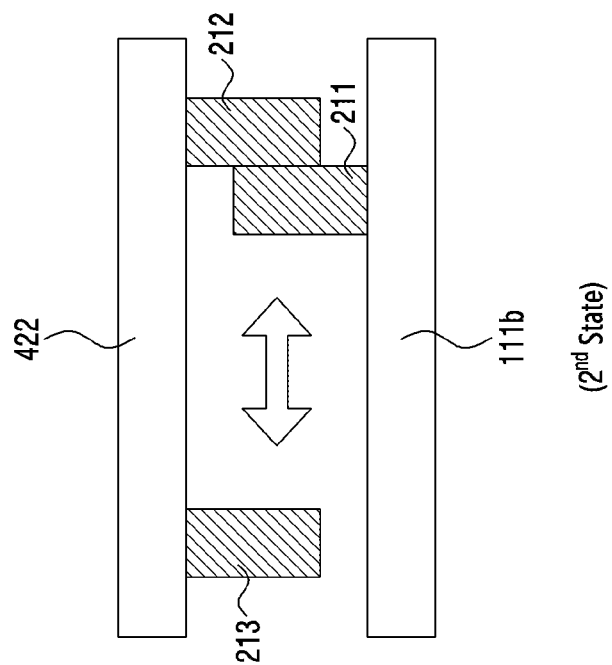

FIG. 4C is a diagram further illustrating a third structure in FIG. 4B according to various embodiments.

Referring to FIG. 4C, according to an embodiment, the third structure 213 may be electrically connected to the ground of the second conductive structure 422. As described above with reference to FIG. 4B, in the second state, as the first structure 211 and the second structure 212 are in contact with each other, the first conductive portion 111b may be electrically connected to the ground of the second conductive structure 422. In the first state, as the first structure 211 and the third structure 213 are in contact with each other, the first conductive portion 111b may be electrically connected to the ground of the second conductive structure 422.

According to an embodiment, as the ground of the first conductive portion 111b and the second conductive structure 422 are electrically connected to each other in the first state and the second state, the electronic device 100 may prevent and/or reduce coupling between the first conductive portion 111b and the second conductive portion 112b in the first state and the second state.

According to an embodiment, as the ground of the first conductive portion 111b and the second conductive structure 422 are electrically connected to each other in the first state and the second state, the electronic device 100 may prevent and/or reduce coupling between the first conductive portion 111b and the second conductive portion 112b in the first state and the second state.

Figure 4D:
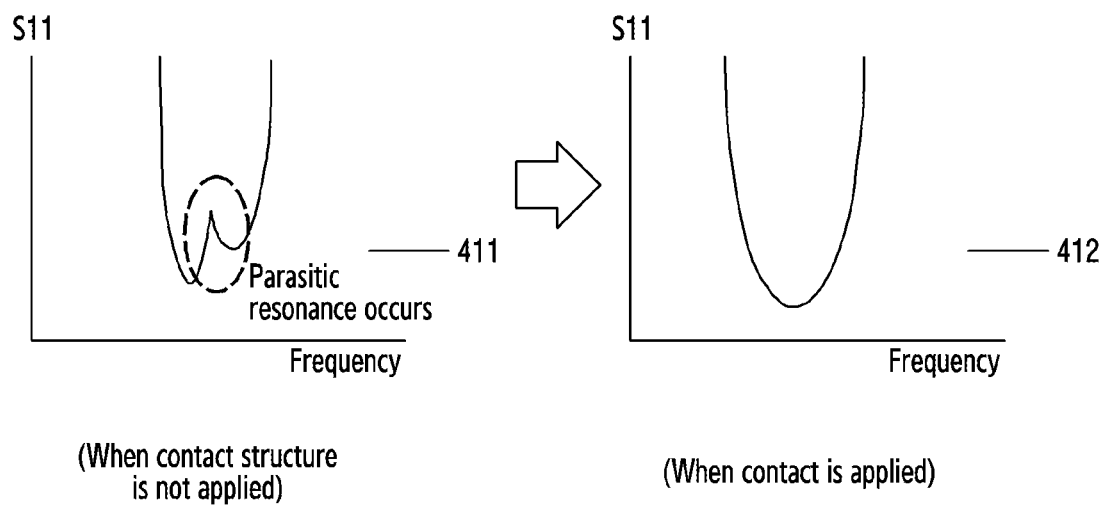
FIG. 4D includes graphs illustrating a change in a reflection coefficient of an antenna of an electronic device according to application of a contact structure according to various embodiments.

FIG. 4D includes graphs illustrating a change in a reflection coefficient of an antenna of an electronic device according to application of a contact structure according to various embodiments.

According to an embodiment, there is illustrated a first graph 411 in which the electronic device 100 represents a reflection coefficient value (e.g., S11) of an antenna to which the contact structure 210 is not applied. In an embodiment, there is illustrated a second graph 412 in which the electronic device 100 represents a reflection coefficient value (e.g., S11) of an antenna to which the contact structure 210 is applied.

According to an embodiment, it can be seen from the first graph 411 that the reflection coefficient value increases in a predetermined frequency band. According to an embodiment, as the second conductive portion 112b overlaps the first conductive portion 111b in the first state, parasitic resonance may occur, and in this case, the reflection coefficient value may increase in a predetermined frequency band.

According to an embodiment, when the second conductive part 112b is used as an antenna radiator, the electronic device 100 may electrically connect the second conductive portion 112b to the ground of the first conductive structure 421. Accordingly, the electronic device 100 may prevent and/or reduce the occurrence of parasitic resonance by preventing and/or reducing coupling between the second conductive portion 112b and the first conductive portion 111b. As another example, the electronic device 100 may electrically connect the first conductive portion 111b serving as an antenna radiator to the ground of the second conductive structure 422. Accordingly, it is possible to prevent and/or reduce the occurrence of parasitic resonance by preventing and/or reducing coupling between the second conductive portion 112b and the first conductive portion 111b.

Figure 5A:
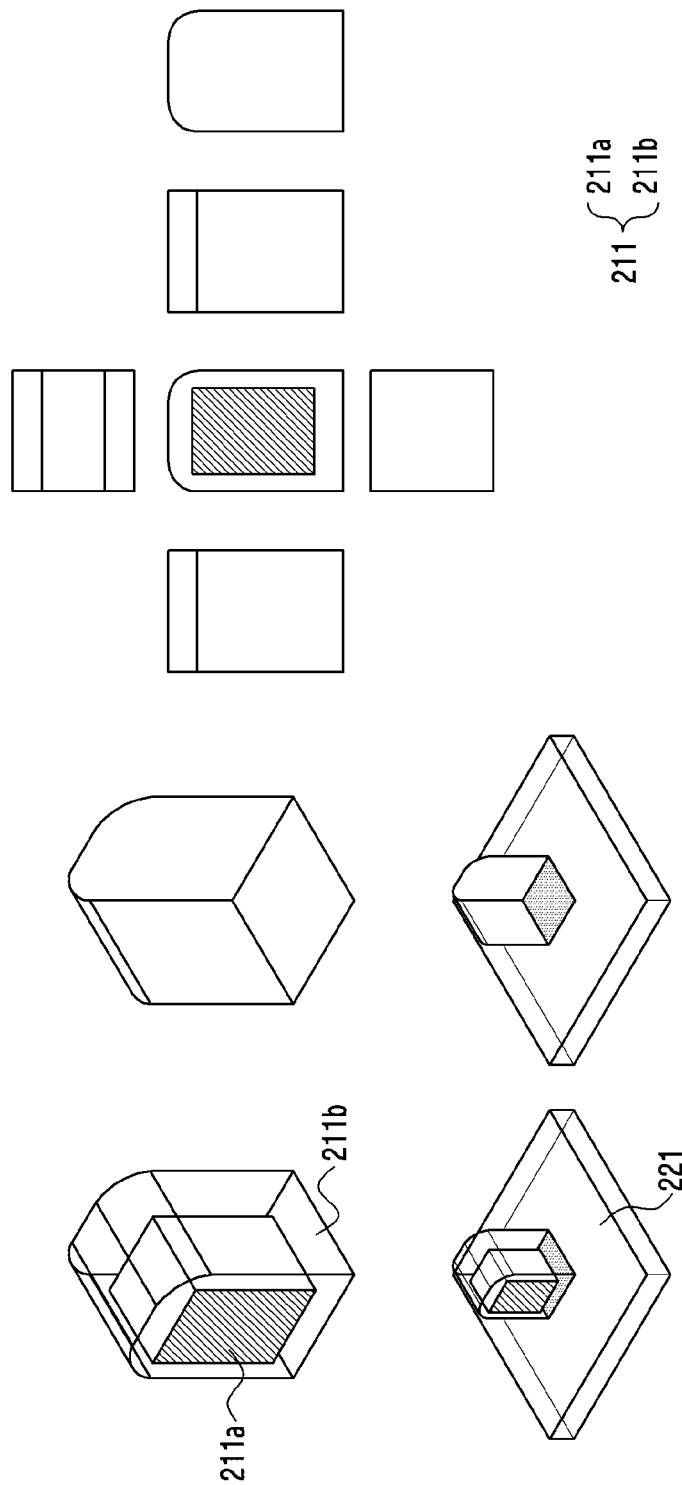
FIG. 5A is a diagram illustrating a first structure in which a magnet is exposed according to various embodiments.

FIG. 5A is a diagram illustrating a first structure in which a magnet is exposed according to various embodiments.

Figure 5B:
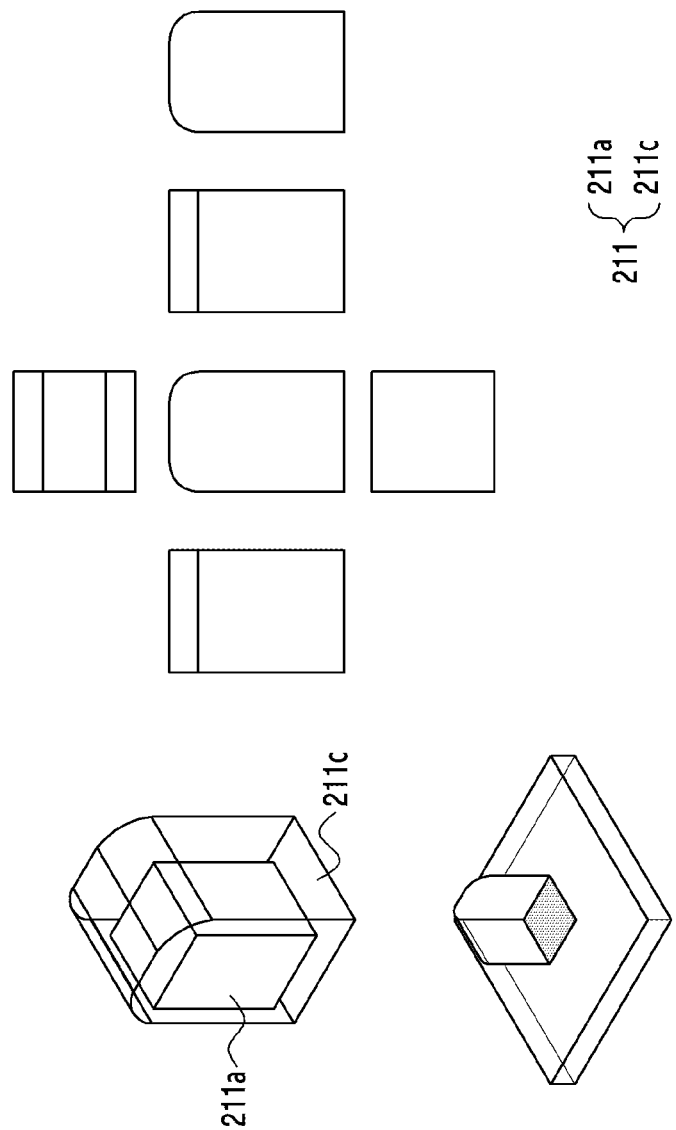
FIG. 5B is a diagram illustrating a first structure in which the magnet is not exposed according to various embodiments.

FIG. 5B is a diagram illustrating a first structure in which the magnet is not exposed according to various embodiments.

Referring to FIGS. 5A and 5B, the first structure 211 of the contact structure 210 according to an embodiment may include a magnet 211a and a partition wall 211b or 211c. In an embodiment, a partition wall 211b of a first type and a partition wall 211c of a second type may be disposed while covering the magnet 211a.

According to an embodiment, the first magnet 211a may or may not be exposed to one surface of the partition wall 211b of the first type or the partition wall 211c of the second type. For example, referring to FIG. 5A, a portion of the first magnet 211a may be exposed to one surface of the partition wall 211b of the first type. As another example, referring to FIG. 5B, the first magnet 211a may not be exposed to the outside of the partition wall 211c by being covered with the partition wall 211c of the second type.

According to an embodiment, the first magnet 211a of the first structure 211 may be exposed to face the second structure 212.

According to an embodiment, the first structure 211 may be coupled to a point of the first printed circuit board 221 through a surface mount device (SMD) method. In an embodiment, the first printed circuit board 221 may be replaced by the second printed circuit board 222. According to an embodiment, the first structure 211 may be disposed on a support member (e.g., a bracket) or a side member of the first housing 111 or the second housing 112.

According to an embodiment, the second structure 212 may include a second magnet corresponding to the first magnet 211a of the first structure 211. In an embodiment, the second magnet may be exposed to the outside to face the first structure 211. In the second state, the second structure 212 may move toward the first structure 211 while being converted to the first state. For example, the first magnet 211a and the second magnet exposed to the outside may be in direct contact with each other. As another example, the partition wall included in the first structure 211 and the partition wall included in the second structure 212 between the first magnet 211a and the second magnet may come into contact with each other due to the magnetic force of the first magnet 211a and the second magnet.

According to an embodiment, the partition walls (e.g., the partition wall 211b of the first type or the partition wall 211c of the second type) may include a conductive material.

According to an embodiment, the description of the configuration and coupling method of the first structure 211 may be substantially equally applied to the second structure 212, the third structure 213, the fourth structure 214, the fifth structure 215, the sixth structure 216, the seventh structure 217, and the eighth structure 218 of the contact structure 210.

Figure 6A:
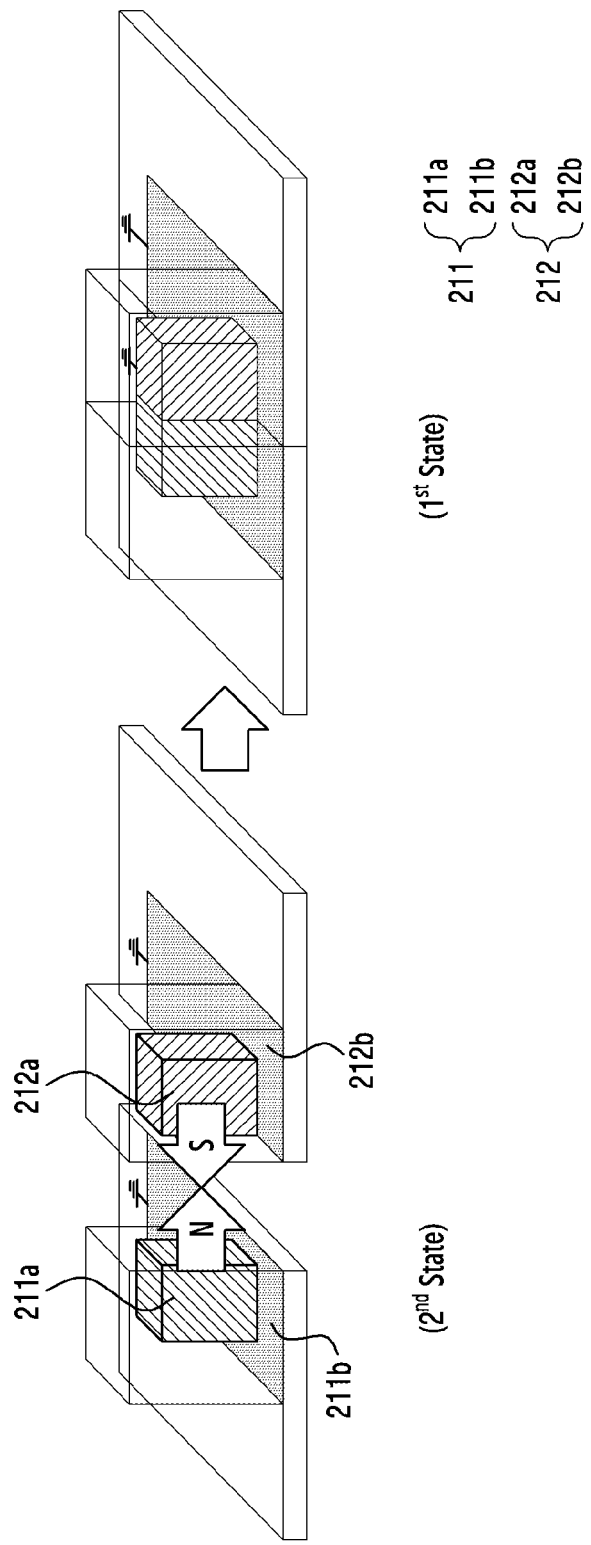
FIG. 6A is a perspective view illustrating an example of a first structure including a first magnet and a second structure including a second magnet according to various embodiments.

FIG. 6A is a diagram illustrating an example of a first structure including a first magnet and a second structure including a second magnet according to various embodiments.

Figure 6B:
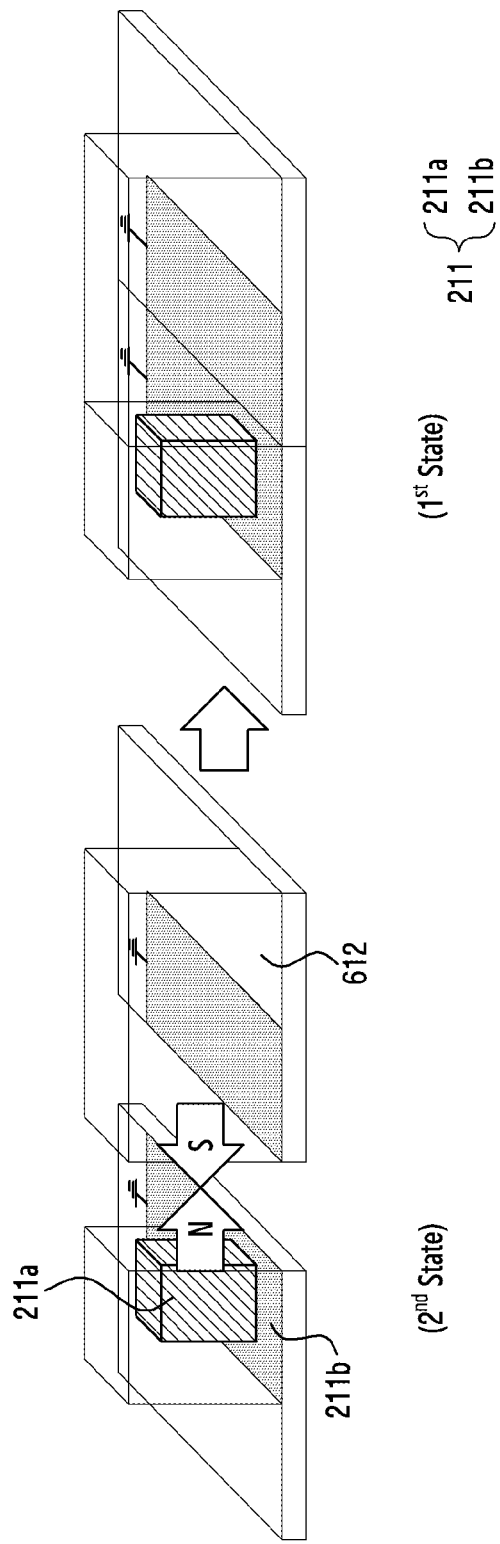
FIG. 6B is a perspective view illustrating an example of a first structure including a first magnet and a structure not including a magnet according to various embodiments.

FIG. 6B is a diagram illustrating an example of a first structure including a first magnet and a structure not including a magnet according to various embodiments.

Referring to FIGS. 6A and 6B, the first structure 211 according to an embodiment may include a first magnet 211a and a first partition wall 211b covering the first magnet 211a.

Referring to FIG. 6A, the second structure 212 according to an embodiment may include a second magnet 212a and a second partition wall 212b covering the second magnet 212a. In an embodiment, the second magnet 212a may have a magnetic property opposite to that of the first magnet 211a.

Referring to FIG. 6B, a structure 612 according to an embodiment may include only a partition wall without including a magnet. In an embodiment, the partition wall included in the structure 612 may include a magnetic material. As another example, a structure 612 may include a conductive material.

According to an embodiment, as the electronic device 100 is converted from the second state to the first state, the first structure 211 may be in electrical contact with the second structure 212 or the structure 612.

For example, referring to FIG. 6A, as the electronic device 100 is converted from the second state to the first state, the first structure 211 and the second structure 212 may be brought into electrical contact with each other by the magnetic force between the first magnet 211a and the second magnet 212a.

As another example, referring to FIG. 6B, as the electronic device 100 is converted from the second state to the first state, the first structure 211 and the structure 612 may be brought into electrical contact with each other by the magnetic force between the first magnet 211a and the magnetic material included in the structure 612.

Figure 7A:
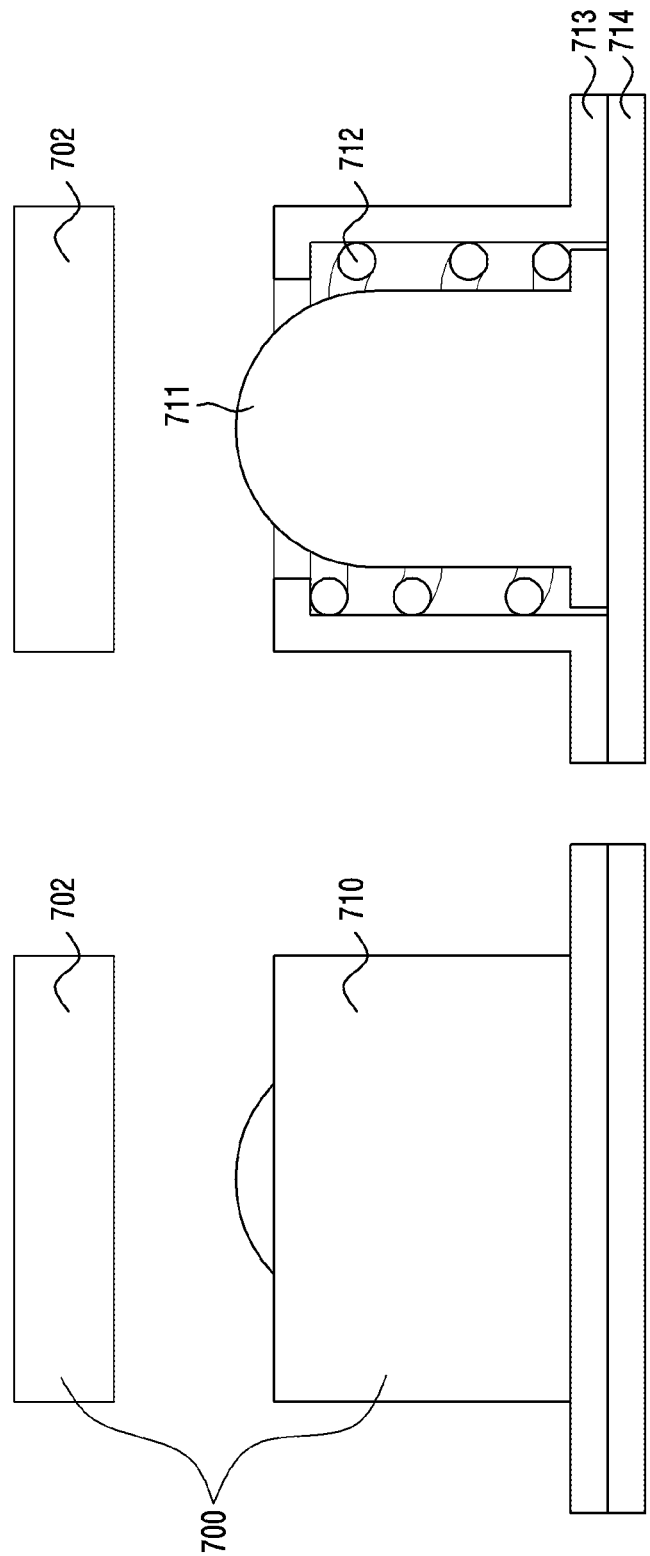
FIG. 7A is a diagram illustrating an example contact structure according to various embodiments.

FIG. 7A is a diagram illustrating an example contact structure according to various embodiments.

Figure 7B:
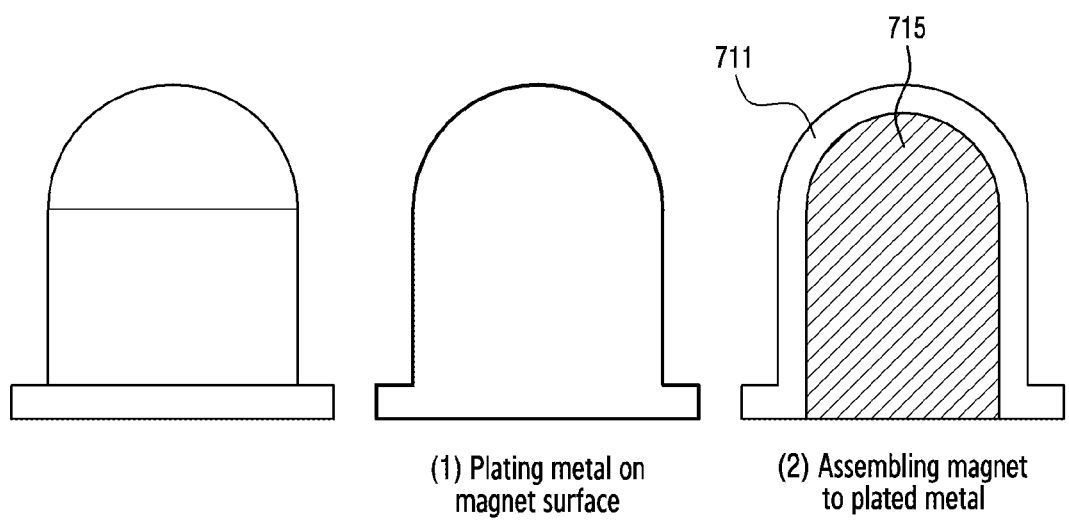
FIG. 7B is a diagram illustrating an example method of manufacturing the contact structure according to various embodiments.

FIG. 7B is a diagram illustrating an example method of manufacturing the contact structure according to various embodiments.

Figure 7C:
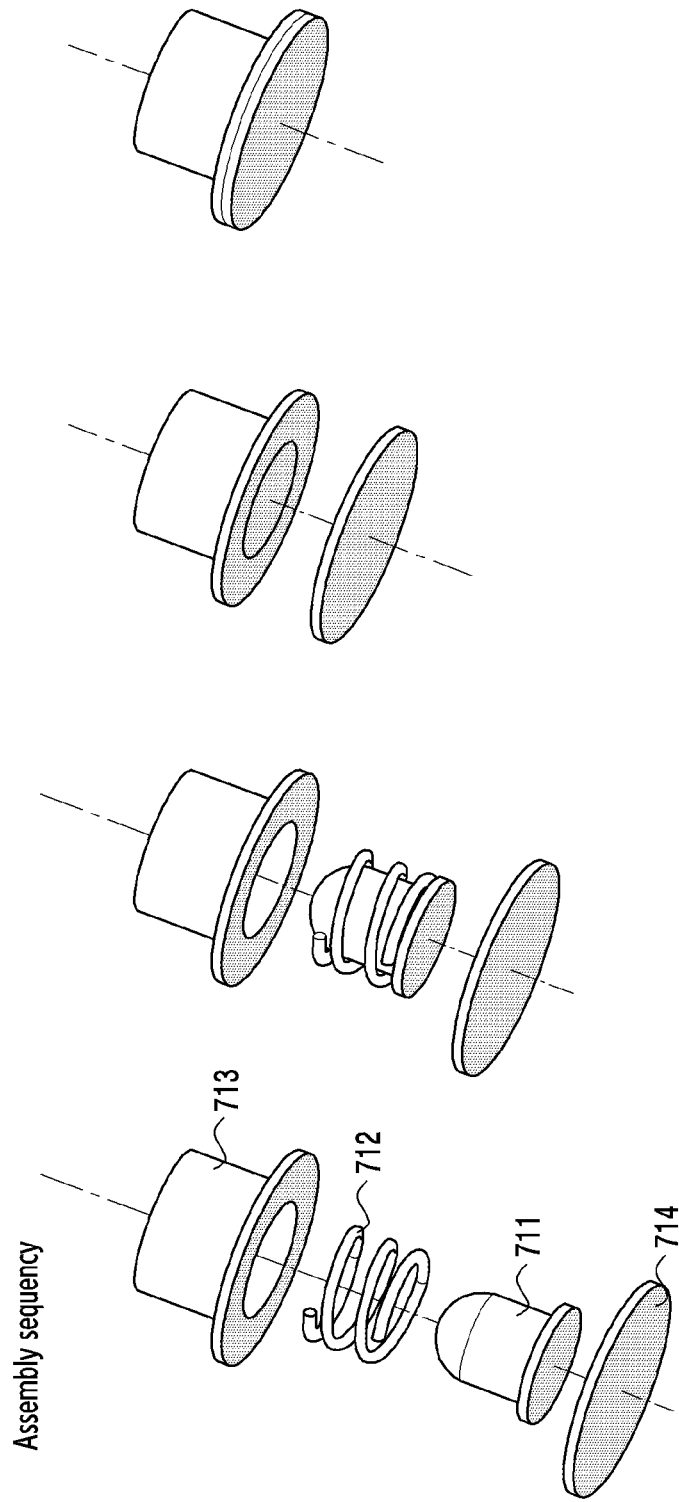
FIG. 7C is a perspective view illustrating an example assembly operation of a contact structure according to various embodiments.

FIG. 7C is a diagram illustrating an example assembly operation of a contact structure according to various embodiments.

Figure 7D:
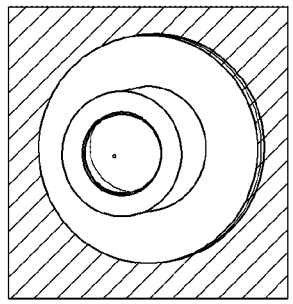
FIG. 7D is a diagram illustrating various example coupling methods of a contact structure according to various embodiments.
Figure 7D:
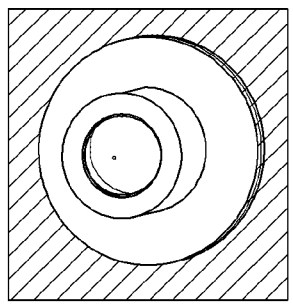
Figure 7D:
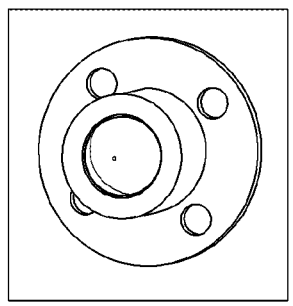
Figure 7D:
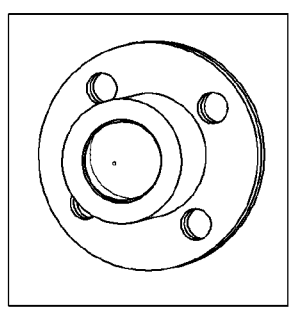
Figure 7D:
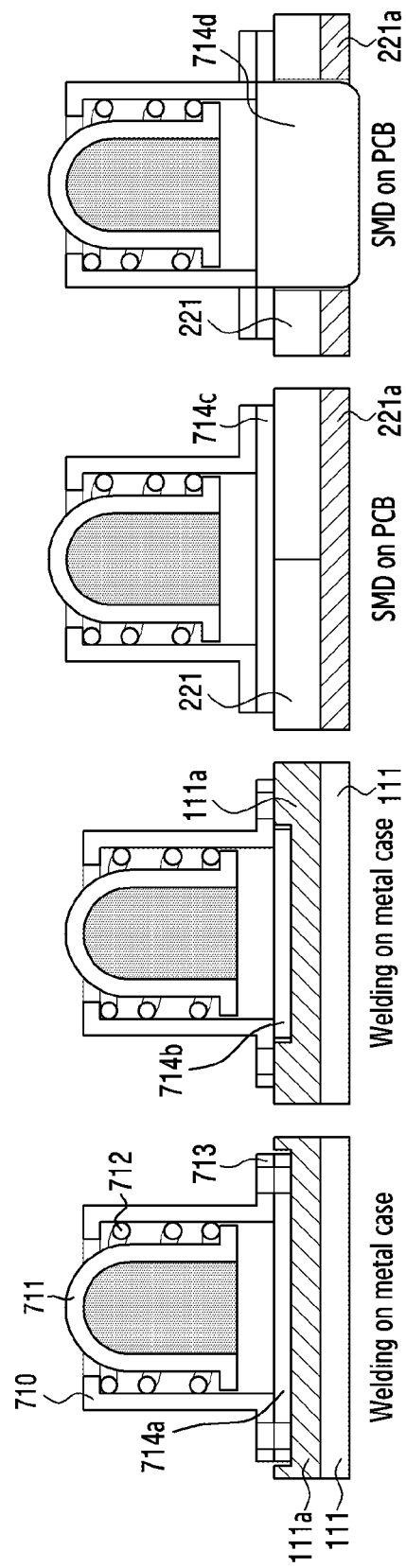

FIG. 7D is a diagram illustrating various example coupling methods of a contact structure according to various embodiments.

Referring to FIGS. 7A and 7B, according to an embodiment, the contact structure 700 may include a first structure 710 and a second structure 702. The first structure 710 may include a first partition wall 711, an elastic member 712, a second partition wall 713, a coupling member 714, and/or a first magnet 715. The second structure 702 may include a magnet as will be described in greater detail below with reference to FIG. 8A. According to an embodiment, the contact structure 700 may replace a contact structure (e.g., the contact structure 210 in FIG. 2).

According to an embodiment, in the first structure 710, the first partition wall 711 may be disposed to cover at least a portion of the first magnet 715. In an embodiment, the second partition wall 713 may be disposed to accommodate at least a portion of the first partition wall 711, and the elastic member 712 may be disposed between the first partition wall 711 and the second partition wall 713 while being wound around the first partition wall 711. In an embodiment, the coupling member 714 may be coupled to the second partition wall 713.

In an embodiment, the first partition wall 711 may be electrically connected to the second partition wall 713 or the coupling member 714. In an embodiment, the second partition wall 713 may include a through hole that is capable of accommodating at least a portion of the first partition wall 711. The second partition wall 713 may be formed of, for example, a non-conductive material.

Referring to FIG. 7B, a structure including the first partition wall 711 and the first magnet 715 according to an embodiment may be referred to as a contact pin, and the contact pin may be manufactured by various methods.

For example, a contact pin may be manufactured by forming the first partition wall 711 by plating a surface of the first magnet 715 with a conductive material (e.g., metal). As another example, the contact pin may be manufactured by insert at least a portion of the first magnet 715 into a pre-formed first partition wall 711.

Referring to FIG. 7C, an operation of assembling the first structure 710 according to an embodiment may include winding an elastic member 712 around the first partition wall 711, introducing the first partition wall 711 into the second partition wall 713, and then causing the second partition wall 713 and the coupling member 714 to be coupled to each other.

Referring to FIG. 7D, the first structure 710 according to an embodiment may be coupled to the first housing 111, the first ground 111a, the second housing 112, the second ground 112a, the first printed circuit board 221, and or the second printed circuit board 222 using coupling members 714a, 714b, 714c, and 714d (e.g., the coupling member 714).

For example, the first structure 710 may be electrically connected to the first ground 111a of the first housing 111 via a first coupling member 714a or a second coupling member 714b. In one example, the first coupling member 714a and the second coupling member 714b may be coupled to the first ground 111a of the first housing 111 through welding.

As another example, the first structure 710 may be coupled to the first printed circuit board 221 via a third coupling member 714c or a fourth coupling member 714d. In an example, the third coupling member 714c may be coupled to the surface of the first printed circuit board 221 and may be electrically connected to the third ground 221a of the first printed circuit board 221. In addition, in an example, the fourth coupling member 714d may be inserted into the first printed circuit board 221 and may be electrically connected to the third ground 221a. In an example, the first printed circuit board 221 may be replaced with the second printed circuit board 222. As another example, the first structure 710 may be disposed adjacent to a conductive portion (e.g., the first conductive portion 111b) of the housing 110 or a conductive structure (e.g., the first conductive structure 421) to be electrically connected to the conductive portion or the ground of the conductive structure. As another example, the first structure 710 may be disposed on a ground of the housing 110 (e.g., the first ground 111a) to be electrically connected to the ground of the housing 110.

Figure 8A:
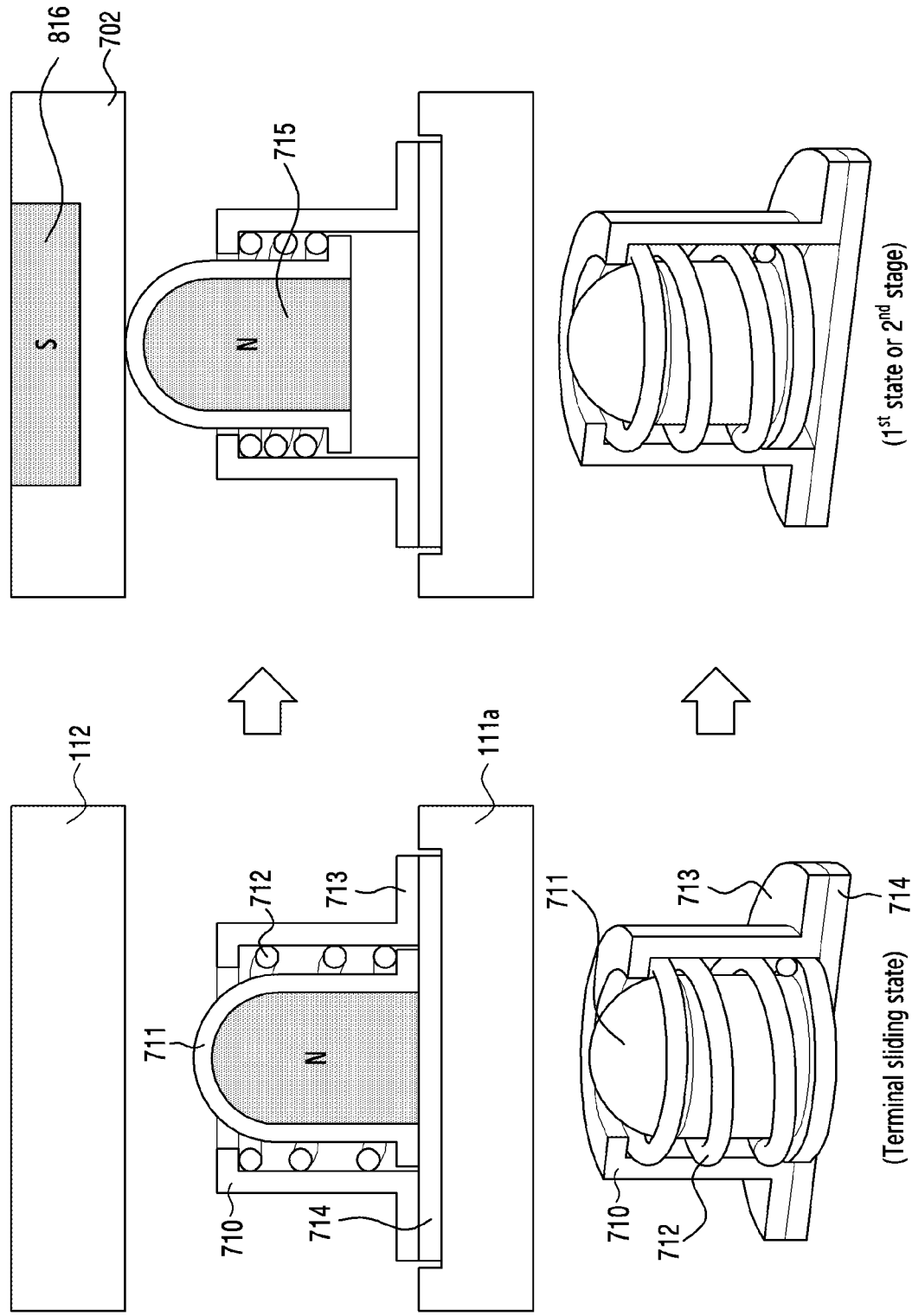
FIG. 8A is a diagram illustrating an example operation of a contact structure according to a state of an electronic device according to various embodiments.

FIG. 8A is a diagram illustrating an example operation of a contact structure according to a state of an electronic device according to various embodiments.

Figure 8B:
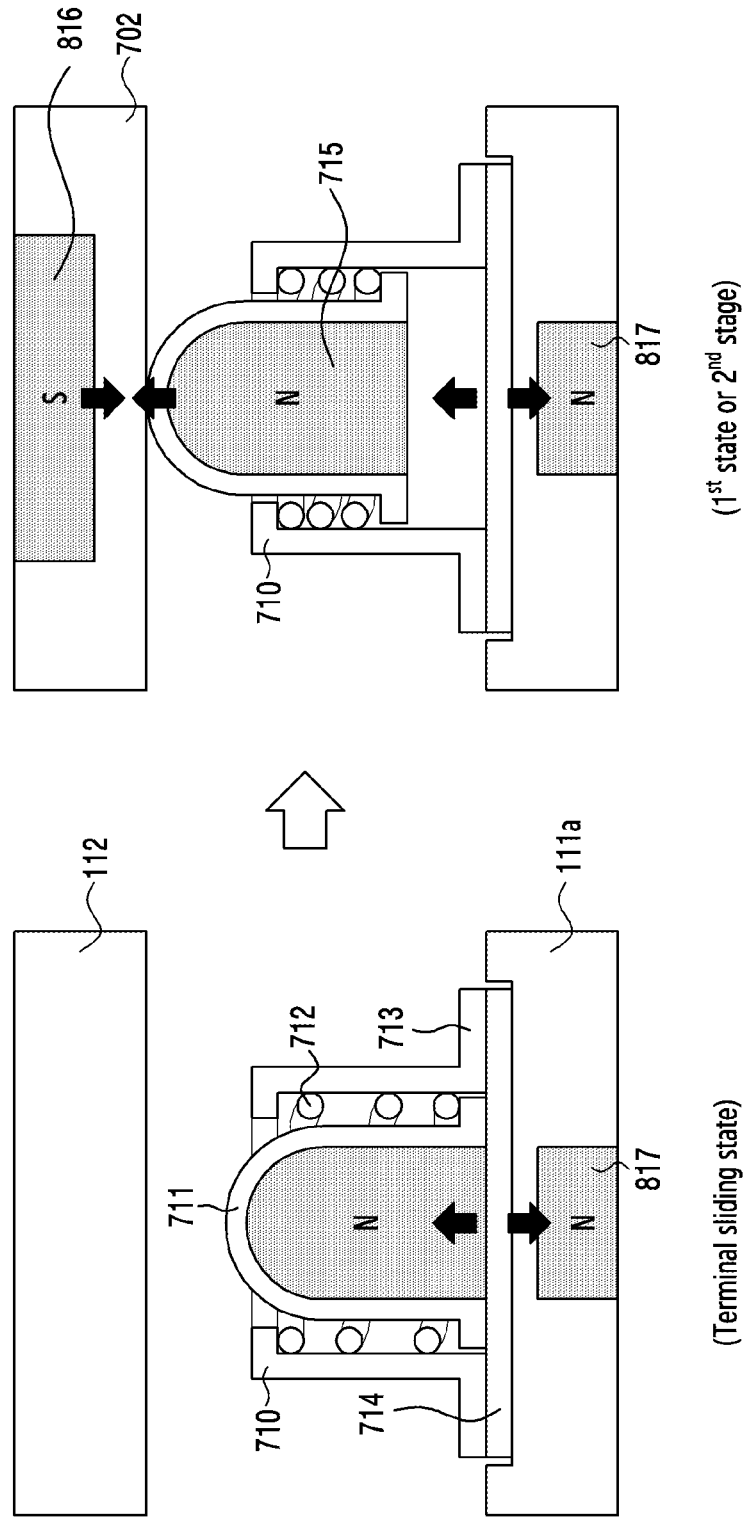
FIG. 8B is a diagram illustrating an example contact structure including a third magnet according to various embodiments.

FIG. 8B is a diagram illustrating an example contact structure including a third magnet according to various embodiments.

Referring to FIG. 8A, according to an embodiment, a second magnet 816 may be included in the second structure 702 to correspond to the position of the first magnet 715. For example, when the electronic device 100 is in the first state or the second state, the first structure 710 and the second structure 702 may come into contact with each other by a magnetic force acting between the second magnet 816 and the first magnet 715. In an example, the first magnet 715 may be disposed adjacent to the second magnet 816 such that a magnetic force can act therebetween.

In an embodiment, when the electronic device 100 is not in the first state or the second state, the magnetic force of the first magnet 715 does not act, and thus at least a portion of the first partition wall 711 may be located inside the second partition wall 713 by the elastic force of the elastic member 712. For example, the magnetic force of the first magnet 715 may be smaller than the elastic force of the elastic member 712. For example, the first partition wall 711 may be located such that the partition wall 711 does not come into contact with components other than those included in the first structure 211.

In an embodiment, when the electronic device 100 is in the first state or the second state, the first structure 710 is adjacent to the second structure 702 and in this case, the first partition wall 711 may move to the outside of the second partition wall 713 toward the second structure 702 by the magnetic force of the first magnet 715 included in the first structure 710 to come into with the second structure 702. In an embodiment, when the electronic device 100 is in the first state or the second state, the first partition wall 711 may more protrude to the outside of the second partition wall 713 compared to the case in which the electronic device 100 is not in the first state or the second state.

According to an embodiment, the second magnet 816 may have a magnetic property opposite to that of the first magnet 715.

According to an embodiment, the second structure 702 may include a magnetic material in place of the second magnet 816. The first structure 710 and the second structure 702 may be in contact with each other through a magnetic force between the first magnet 715 and a magnetic material included in the second structure 702 in the first state and the second state. According to an embodiment, the second structure 702 may include a magnetic material and a second magnet 816. In this case, in the first state and the second state, a magnetic force may act between the magnetic material and the second magnet 816 and the first magnet 715.

According to an embodiment, in the first state or the second state, the contact structure 700 may electrically connect the first ground 111a of the first housing 111 and the second ground 112a of the second housing 112 to each other. For example, in the first state or the second state, due to the magnetic force between the first magnet 715 and the second magnet 816, the first partition wall 711 of the first structure 710 may move toward the second structure 702 through an opening in the second partition wall 713 and may come into contact with the second structure 702. For example, the second structure 702 may be in the state of being electrically connected to the second ground 112a of the second housing 112, and in this case, the first ground 111a of the first housing 111 and the second ground 112a of the second housing 112 may be electrically connected to each other.

According to an embodiment, the first partition wall 711 may be entered into the second partition wall 713 as the second housing 112 slides. For example, as the electronic device 100 is converted from the first state to the second state, the second housing 112 may slide within a predetermined range. Due to the sliding, the second magnet 816 may move beyond a predetermined distance in no magnetic force acts. In this case, the first partition wall 711 may be entered into the second partition wall 713.

According to an embodiment, as the first partition wall 711 is entered into the inside of the second partition wall 713, the first ground 111a of the first housing 111 and the second ground 112a of the second housing 112 may not be electrically connected to each other while the second housing 112 slides.

Referring to FIG. 8B, according to an embodiment, a third magnet 817 may be disposed in the first housing 111 to correspond to the position of the first magnet 715. For example, the third magnet 817 may be disposed on the first ground 111a of the first housing 111 to which the first structure 710 is coupled.

According to an embodiment, the third magnet 817 may be included in the first structure 710. For example, the first structure 710 may include a connection member connecting a separate coupling member 714 and the first housing 111 between the coupling member 714 and the first housing 111, and a third magnet 817 may be disposed on the connection member. According to an embodiment, the third magnet 817 may have the same magnetic property as the first magnet 715. In an embodiment, using the fact that the first magnet 715 and the third magnet 817 have the same magnetic property, it is possible to facilitate the contact of the first partition wall 711 of the first structure 710 with the second ground 112a of the second housing 112 in the first state or the second state.

For example, in the first state, an attractive force may act between the first magnet 715 and the second magnet 816, and a repulsive force may act between the first magnet 715 and the third magnet 817. In an example, the first partition wall 711 may move toward the second housing 112 through the opening in the second partition wall 713 based on the attractive and repulsive forces. In this case, the first partition wall 711 may come into contact with the second ground 112a of the second housing 112.

Figure 9:
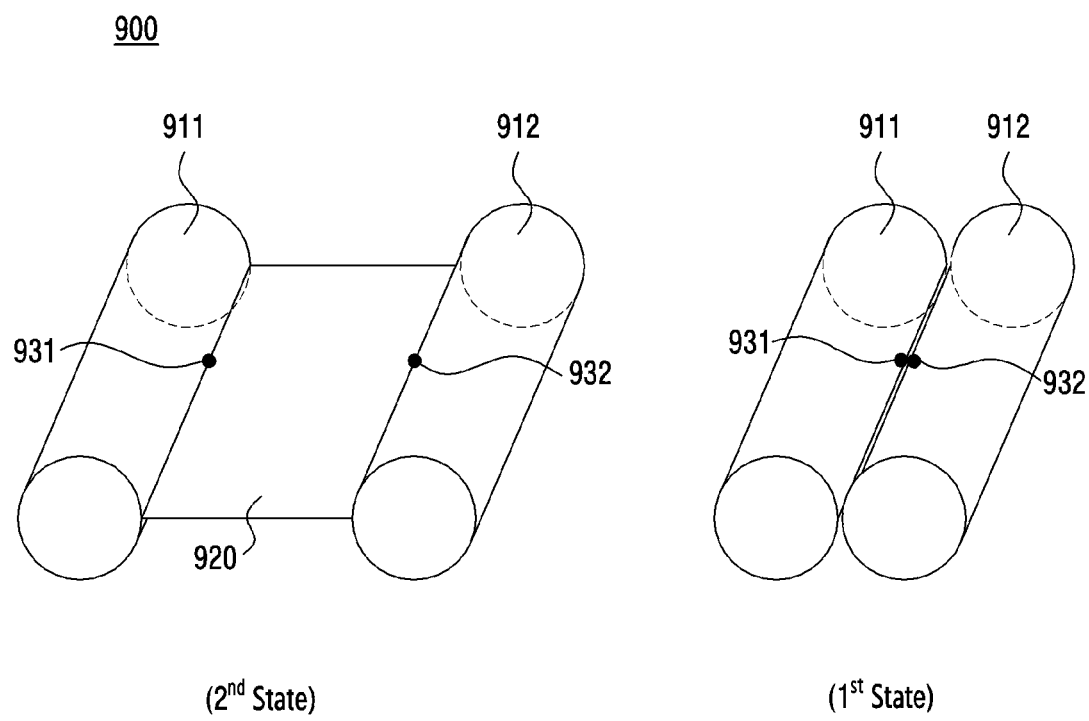
FIG. 9 is a diagram illustrating a rollable electronic device including a flexible display according to an embodiment various embodiments.

FIG. 9 is a diagram illustrating an example rollable electronic device including a flexible display according to various embodiments.

Referring to FIG. 9, a rollable electronic device 900 according to an embodiment may include a first housing 911, a second housing 912, and a flexible display 920.

According to an embodiment, in the second state of the rollable electronic device 900, the first housing 911 and the second housing 912 may be disposed to be spaced apart from each other by a predetermined distance or more. In an embodiment, the flexible display 920 may be pulled out of at least one of the first housing 911 and the second housing 912 to be viewed to the outside.

According to an embodiment, in the first state of the rollable electronic device 900, the first housing 911 and the second housing 912 may be disposed adjacent to each other. In an embodiment, the flexible display 920 may be entered into at least one of the first housing 911 and the second housing 912 not to be viewed from the outside. As another example, when the flexible display 920 may be viewed from the outside more in the second state than in the first state.

According to an embodiment, the first housing 911 may include a first structure 931 of a contact structure 930 in one region, and the second housing 912 may include a second structure 932 to correspond to the position of the first structure 931.

According to an embodiment, in the first state, the ground of the first housing 911 and the ground of the second housing 912 may be electrically connected to each other via the contact structure 930. For example, in the first state, the first housing 911 and the second housing 912 may be disposed adjacent to each other, and as the first structure 931 and the second structure 932 are in electrical contact with each other, the ground of the first housing 911 and the ground of the second housing 912 may be electrically connected to each other.

Figure 10:
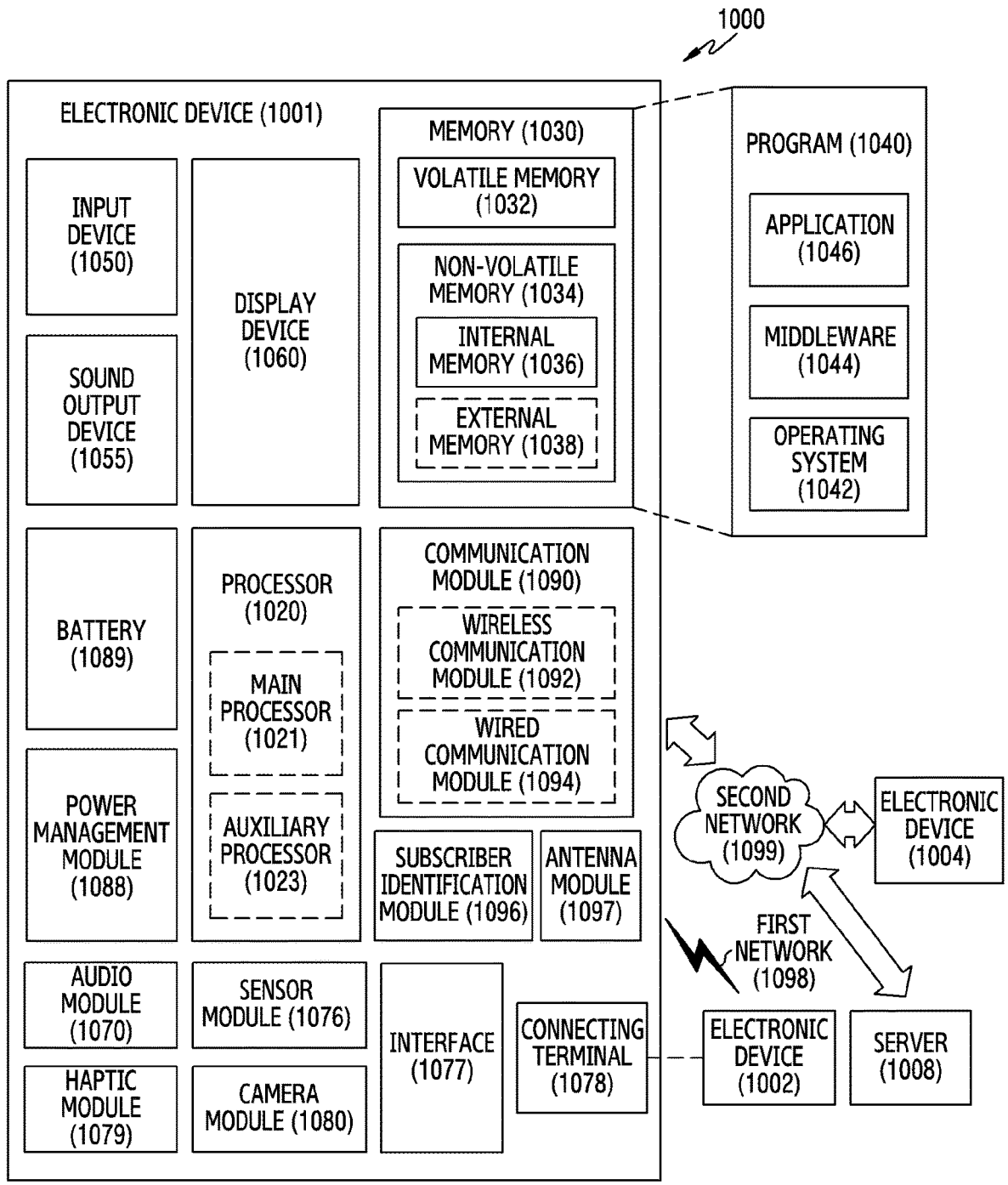
FIG. 10 is a block diagram of illustrating an example electronic device in a network environment according to various embodiments.

FIG. 10 is a block diagram illustrating an example electronic device 1001 in a network environment 1000 according to various embodiments. Referring to FIG. 10, the electronic device 1001 in the network environment 1000 may communicate with an electronic device 1002 via a first network 1098 (e.g., a short-range wireless communication network), or at least one of an electronic device 1004 or a server 1008 via a second network 1099 (e.g., a long-range wireless communication network). According to an embodiment, the electronic device 1001 may communicate with the electronic device 1004 via the server 1008. According to an embodiment, the electronic device 1001 may include a processor 1020, memory 1030, an input module 1050, a sound output module 1055, a display module 1060, an audio module 1070, a sensor module 1076, an interface 1077, a connecting terminal 1078, a haptic module 1079, a camera module 1080, a power management module 1088, a battery 1089, a communication module 1090, a subscriber identification module (SIM) 1096, or an antenna module 1097. In various embodiments, at least one of the components (e.g., the connecting terminal 1078) may be omitted from the electronic device 1001, or one or more other components may be added in the electronic device 1001. In various embodiments, some of the components (e.g., the sensor module 1076, the camera module 1080, or the antenna module 1097) may be implemented as a single component (e.g., the display module 1060).

The processor 1020 may execute, for example, software (e.g., a program 1040) to control at least one other component (e.g., a hardware or software component) of the electronic device 1001 coupled with the processor 1020, and may perform various data processing or computation. According to an embodiment, as at least part of the data processing or computation, the processor 1020 may store a command or data received from another component (e.g., the sensor module 1076 or the communication module 1090) in volatile memory 1032, process the command or the data stored in the volatile memory 1032, and store resulting data in non-volatile memory 1034. According to an embodiment, the processor 1020 may include a main processor 1021 (e.g., a central processing unit (CPU) or an application processor (AP)), or an auxiliary processor 1023 (e.g., a graphics processing unit (GPU), a neural processing unit (NPU), an image signal processor (ISP), a sensor hub processor, or a communication processor (CP)) that is operable independently from, or in conjunction with, the main processor 1021. For example, when the electronic device 1001 includes the main processor 1021 and the auxiliary processor 1023, the auxiliary processor 1023 may be adapted to consume less power than the main processor 1021, or to be specific to a specified function. The auxiliary processor 1023 may be implemented as separate from, or as part of the main processor 1021.

The auxiliary processor 1023 may control at least some of functions or states related to at least one component (e.g., the display module 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to an embodiment, the auxiliary processor 1023 (e.g., an image signal processor or a communication processor) may be implemented as part of another component (e.g., the camera module 1080 or the communication module 1090) functionally related to the auxiliary processor 1023. According to an embodiment, the auxiliary processor 1023 (e.g., the neural processing unit) may include a hardware structure specified for artificial intelligence model processing. An artificial intelligence model may be generated by machine learning. Such learning may be performed, e.g., by the electronic device 1001 where the artificial intelligence is performed or via a separate server (e.g., the server 1008). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046. The input module 1050 may receive a command or data to be used by another component (e.g., the processor 1020) of the electronic device 1001, from the outside (e.g., a user) of the electronic device 1001. The input module 1050 may include, for example, a microphone, a mouse, a keyboard, a key (e.g., a button), or a digital pen (e.g., a stylus pen).

The sound output module 1055 may output sound signals to the outside of the electronic device 1001. The sound output module 1055 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1060 may visually provide information to the outside (e.g., a user) of the electronic device 1001. The display module 1060 may include, for example, a display, a hologram device, or a projector and control circuitry to control a corresponding one of the display, hologram device, and projector. According to an embodiment, the display module 1060 may include a touch sensor adapted to detect a touch, or a pressure sensor adapted to measure the intensity of force incurred by the touch.

The audio module 1070 may convert a sound into an electrical signal and vice versa. According to an embodiment, the audio module 1070 may obtain the sound via the input module 1050, or output the sound via the sound output module 1055 or a headphone of an external electronic device (e.g., an electronic device 1002) directly (e.g., wiredly) or wirelessly coupled with the electronic device 1001.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. According to an embodiment, the sensor module 1076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device (e.g., the electronic device 1002) directly (e.g., wiredly) or wirelessly. According to an embodiment, the interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device (e.g., the electronic device 1002). According to an embodiment, the connecting terminal 1078 may include, for example, a HDMI connector, a USB connector, a SD card connector, or an audio connector (e.g., a headphone connector).

The haptic module 1079 may convert an electrical signal into a mechanical stimulus (e.g., a vibration or a movement) or electrical stimulus which may be recognized by a user via his tactile sensation or kinesthetic sensation. According to an embodiment, the haptic module 1079 may include, for example, a motor, a piezoelectric element, or an electric stimulator.

The camera module 1080 may capture a still image or moving images. According to an embodiment, the camera module 1080 may include one or more lenses, image sensors, image signal processors, or flashes.

The power management module 1088 may manage power supplied to the electronic device 1001. According to an embodiment, the power management module 1088 may be implemented as at least part of, for example, a power management integrated circuit (PMIC).

The battery 1089 may supply power to at least one component of the electronic device 1001. According to an embodiment, the battery 1089 may include, for example, a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel. The communication module 1090 may include one or more communication processors that are operable independently from the processor 1020 (e.g., the application processor (AP)) and supports a direct (e.g., wired) communication or a wireless communication. According to an embodiment, the communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 1098 (e.g., a short-range communication network, such as Bluetooth™, wireless-fidelity (Wi-Fi) direct, or infrared data association (IrDA)) or the second network 1099 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module 1096.

The wireless communication module 1092 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1092 may support a high-frequency band (e.g., the mmWave band) to achieve, e.g., a high data transmission rate. The wireless communication module 1092 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1092 may support various requirements specified in the electronic device 1001, an external electronic device (e.g., the electronic device 1004), or a network system (e.g., the second network 1099). According to an embodiment, the wireless communication module 1092 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1097 may transmit or receive a signal or power to or from the outside (e.g., the external electronic device) of the electronic device 1001. According to an embodiment, the antenna module 1097 may include an antenna including a radiating element including a conductive material or a conductive pattern formed in or on a substrate (e.g., a printed circuit board (PCB)). According to an embodiment, the antenna module 1097 may include a plurality of antennas (e.g., array antennas). In such a case, at least one antenna appropriate for a communication scheme used in the communication network, such as the first network 1098 or the second network 1099, may be selected, for example, by the communication module 1090 (e.g., the wireless communication module 1092) from the plurality of antennas. The signal or the power may then be transmitted or received between the communication module 1090 and the external electronic device via the selected at least one antenna. According to an embodiment, another component (e.g., a radio frequency integrated circuit (RFIC)) other than the radiating element may be additionally formed as part of the antenna module 1097.

According to various embodiments, the antenna module 1097 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1001 and the external electronic device 1004 via the server 1008 coupled with the second network 1099. Each of the electronic devices 1002 or 1004 may be a device of a same type as, or a different type, from the electronic device 1001. According to an embodiment, all or some of operations to be executed at the electronic device 1001 may be executed at one or more of the external electronic devices 1002, 1004, or 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, mobile edge computing (MEC), or client-server computing technology may be used, for example. The electronic device 1001 may provide ultra low-latency services using, e.g., distributed computing or mobile edge computing. In an embodiment, the external electronic device 1004 may include an internet-of-things (IoT) device. The server 1008 may be an intelligent server using machine learning and/or a neural network. According to an embodiment, the external electronic device 1004 or the server 1008 may be included in the second network 1099. The electronic device 1001 may be applied to intelligent services (e.g., smart home, smart city, smart car, or healthcare) based on 5G communication technology or IoT-related technology.

An electronic device according to an example embodiment may include a housing including a first housing and a second housing, a wireless communication circuit, and at least one contact structure. The first housing may include a ground, and the second housing may be connected to the first housing to be slidable and may include a conductive portion. In a first state, the second housing may be configured to move in a first direction away from the first housing to be changed to a second state, and in a second state, the second housing may be configured to move in a second direction opposite the first direction to be changed to the first state. In the first state, the at least one contact structure comprising a conductor may be configured to electrically connect the ground of the first housing to the conductive portion of the second housing, and the wireless communication circuit may be configured to receive a signal of a specified frequency band by feeding power to a point of the conductive portion of the second housing.

According to an example embodiment, in the second state, the at least one contact structure may be configured to electrically connect the ground of the first housing to the conductive portion of the second housing.

According to an example embodiment, the at least one contact structure may include a first structure comprising a conductive material and a second structure comprising a conductive material, the first structure may be connected to a point of the ground of the first housing, the second structure may be connected to the conductive portion of the second housing, and in the first state, the first structure and the second structure may contact each other.

According to an example embodiment, the electronic device is configured such that while the electronic device is changed from the first state to the second state or while the electronic device is changed from the second state to the first state, the first structure and the second structure are spaced apart from each other by a specified distance and may not be electrically connected to each other.

According to an example embodiment, the at least one contact structure may include a first structure and a second structure, and the first structure may include a first magnet, and a first partition wall covering the first magnet and may be configured to be electrically connected to the ground of the first housing, and the second structure may include a conductive material and be electrically connected to the conductive portion of the second housing.

According to an example embodiment, the second structure may include a second partition wall.

According to an example embodiment, the second structure may include a second magnet and a second partition wall covering the second magnet.

According to an example embodiment, a portion of the first magnet of the first structure may be exposed to outside of the first partition wall to face the second structure, and a portion of the second magnet of the second structure may be exposed to the outside of the second partition wall to face the first structure.

According to an example embodiment, the contact structure may include a first structure and a second structure. The first structure may include a first magnet, a first partition wall covering the first magnet, a second partition wall spaced apart from the first partition wall and surrounding the first partition wall, and an elastic member comprising a winding disposed between the first partition wall and the second partition wall and wound around the first partition wall, and may be electrically connected to the ground of the first housing. The second structure may include a second magnet and a third partition wall covering the second magnet, and may be electrically connected to the conductive portion of the second housing.

The electronic device according to an example embodiment may further include a third magnet, and the third magnet may be included in the first housing corresponding to a position of the first magnet of the first structure.

An electronic device according to an example embodiment may include: a housing including a first housing and a second housing, a wireless communication circuit, at least one contact structure comprising a conductor. The second housing may be connected to the first housing to be slidable and may include a conductive portion. A conductive structure may be disposed in the housing, and the conductive structure may include a ground in at least one portion thereof. In a first state, the second housing may be configured to move in a first direction away from the first housing to be changed to a second state, and in a second state, the second housing may be configured to move in a second direction opposite the first direction to be changed to the first state. In the first state, the at least one contact structure may be configured to electrically connect the ground of the conductive structure to the conductive portion of the second housing, and the wireless communication circuit may be configured to receive a signal of a specified frequency band by feeding power to a point of the conductive portion of the second housing.

According to an example embodiment, the conductive structure may correspond to a printed circuit board.

According to an example embodiment, the at least one contact structure may include a first structure and a second structure, the first structure may include a first magnet, and a first partition wall covering the first magnet and may be electrically connected to the ground of the conductive structure, and the second structure may comprise a conductive material and be electrically connected to the conductive portion of the second housing.

According to an example embodiment, the second structure may include a second magnet and a second partition wall covering the second magnet.

According to an example embodiment, the contact structure may include a first structure and a second structure. The first structure may include a first magnet, a first partition wall covering the first magnet, a second partition wall spaced apart from the first partition wall and surrounding the first partition wall, and an elastic member comprising a winding disposed between the first partition wall and the second partition wall and wound around the first partition wall and may be electrically connected to the ground of the conductive structure. The second structure may include a second magnet and a third partition wall covering the second magnet, and may be electrically connected to the conductive portion of the second housing.

An electronic device according to an example embodiment may include: a housing including a first housing and a second housing, a wireless communication circuit, and at least one contact structure comprising a conductor. The first housing may include a first ground in one region, and the second housing may be connected to the first housing to be slidable and includes a second ground in a region. In a first state, the second housing may be configured to move in a first direction away from the first housing to be change to a second state, and in a second state, the second housing may be configured to move in a second direction opposite the first direction to be changed to the first state. The at least one contact structure may be configured to electrically connect the first ground to the second ground in the first state, the conductive portion of the housing may be electrically connected to at least one of the first ground and the second ground, and the wireless communication circuit may be configured to receive a signal of a specified frequency band by feeding power to a point of the conductive portion.

According to an example embodiment, the at least one contact structure may include a first structure comprising a conductive material and a second structure comprising a conductive material, the first structure may be connected to a point of the first ground, and the second structure may be connected to a point of the second ground. In the first state, the first structure and the second structure may be in electrical contact with each other.

According to an example embodiment, the at least one contact structure may include a first structure and a second structure, the first structure may include a first magnet and a first partition wall covering the first magnet and may be electrically connected to the first ground of the first housing, and the second structure may comprise a conductive material and be electrically connected to the second ground of the second housing.

According to an example embodiment, the contact structure may include a first structure and a second structure. The first structure may include a first magnet, a first partition wall covering the first magnet, a second partition wall spaced apart from the first partition wall and surrounding the first partition wall, and an elastic member comprising a winding disposed between the first partition wall and the second partition wall and wound around the first partition wall and may be electrically connected to the first ground of the first housing, and the second structure may include a second magnet and a third partition wall covering the second magnet and may be electrically connected to the second ground of the second housing.

According to an example embodiment, in the second state, the at least one contact structure may be configured to electrically connect the first ground to the second ground.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1040) including one or more instructions that are stored in a storage medium (e.g., internal memory 1036 or external memory 1038) that is readable by a machine (e.g., the electronic device 1001). For example, a processor (e.g., the processor 1020) of the machine (e.g., the electronic device 1001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" the storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
    a housing including a first housing and a second housing, wherein the first housing includes a ground, and the second housing is connected to the first housing to be slidable and includes a conductive portion;
    a wireless communication circuit; and
    at least one contact structure comprising a conductor,
    wherein in a first state, the second housing is configured to move in a first direction away from the first housing to be changed to a second state, and in a second state, the second housing is configured to move in a second direction opposite the first direction to be changed to the first state, and
    wherein the at least one contact structure is configured to electrically connect the ground of the first housing to the conductive portion of the second housing in the first state, and
    wherein the wireless communication circuit is configured to receive a signal of a specified frequency band by feeding power to a point of the conductive portion of the second housing.

2. The electronic device of claim 1, wherein, in the second state, the at least one contact structure is configured to electrically connect the ground of the first housing to the conductive portion of the second housing.

3. The electronic device of claim 1, wherein the at least one contact structure includes a first structure comprising a first conductive material and a second structure comprising a second conductive material,
    wherein the first structure is connected to a point of the ground of the first housing, and the second structure is connected to the conductive portion of the second housing, and
    wherein in the first state, the first structure and the second structure are in contact with each other.

4. The electronic device of claim 3, wherein while the electronic device is changed from the first state to the second state or while the electronic device is changed from the second state to the first state, the first structure and the second structure are spaced apart from each other by a specified distance and are not electrically connected to each other.

5. The electronic device of claim 1, wherein the at least one contact structure includes a first structure and a second structure,
  wherein the first structure includes a first magnet, and a first partition wall covering the first magnet and is electrically connected to the ground of the first housing, and
  wherein the second structure comprises a conductive material and is electrically connected to the conductive portion of the second housing.

6. The electronic device of claim 5, wherein the second structure includes a second partition wall.

7. The electronic device of claim 5, wherein the second structure includes a second magnet and a second partition wall covering the second magnet.

8. The electronic device of claim 7, wherein a portion of the first magnet of the first structure is exposed to outside of the first partition to face the second structure, and
  wherein a portion of the second magnet of the second structure is exposed to outside of the second partition wall to face the first structure.

9. The electronic device of claim 1, wherein the contact structure includes a first structure and a second structure,
  wherein the first structure includes:
    a first magnet,
    a first partition wall covering the first magnet,
    a second partition wall spaced apart from the first partition wall and surrounding the first partition wall, and
    an elastic member comprising a winding disposed between the first partition wall and the second partition wall and wound around the first partition, the first structure being electrically connected to the ground of the first housing, and
  wherein the second structure includes a second magnet and a third partition wall covering the second magnet and is electrically connected to the conductive portion of the second housing.

10. The electronic device of claim 9, further comprising:
  a third magnet, and
  wherein the third magnet is included in the first housing corresponding to a position of the first magnet of the first structure.

11. An electronic device comprising:
  a housing including a first housing and a second housing, wherein the second housing is connected to the first housing to be slidable and includes a conductive portion;
  a conductive structure comprising a conductive material disposed within the housing, wherein the conductive structure includes a ground at least at a portion thereof;
  a wireless communication circuit; and
  at least one contact structure comprising a conductor, and
  wherein in a first state, the second housing is configured to move in a first direction away from the first housing to be changed to a second state, and in a second state, the second housing is configured to move in a second direction opposite the first direction to be changed to the first state,
  wherein the at least one contact structure is configured to electrically connect the ground of the conductive structure to the conductive portion of the second housing in the first state, and
  wherein the wireless communication circuit is configured to receive a signal of a specified frequency band by feeding power to a point of the conductive portion of the second housing.

12. The electronic device of claim 11, wherein the conductive structure corresponds to a printed circuit board.

13. The electronic device of claim 11, wherein the at least one contact structure includes a first structure and a second structure,
  wherein the first structure includes a first magnet, and a first partition wall covering the first magnet and is electrically connected to the ground of the first housing, and
  wherein the second structure comprises a conductive material and is electrically connected to the conductive portion of the second housing.

14. The electronic device of claim 13, wherein the second structure includes a second magnet and a second partition wall covering the second magnet.

15. The electronic device of claim 11, wherein the contact structure includes a first structure and a second structure,
  wherein the first structure includes:
    a first magnet,
    a first partition wall covering the first magnet,
    a second partition wall spaced apart from the first partition wall and surrounding the first partition wall,
    and an elastic member comprising a winding disposed between the first partition wall and the second partition wall and wound around the first partition wall, the first structure being electrically connected to the ground of the first housing, and
  wherein the second structure includes a second magnet and a third partition wall covering the second magnet, the second structure being electrically connected to the conductive portion of the second housing.

16. An electronic device comprising:
  a housing including a first housing and a second housing, wherein the first housing includes a first ground in one region thereof, and the second housing is connected to the first housing to be slidable and includes a second ground in a region;
  a wireless communication circuit; and
  at least one contact structure comprising a conductor, and
  wherein, in a first state, the second housing is configured to move in a first direction away from the first housing to be changed to a second state, and in a second state, the second housing is configured to move in a second direction opposite the first direction to be changed to the first state,
  wherein the at least one contact structure is configured to electrically connect the first ground to the second ground in the first state,
  wherein the conductive portion of the housing is electrically connected to at least one of the first ground and the second ground, and
  wherein the wireless communication circuit is configured to receive a signal of a specified frequency band by feeding power to a point of the conductive portion.

17. The electronic device of claim 16, wherein the at least one contact structure includes a first structure and a second structure,
  wherein the first structure comprises a first conductive material and is connected to a point of the first ground, and the second structure comprises a second conductive material and is connected to a point of the second ground, and wherein in the first state, the first structure and the second structure are in electrical contact with each other.

18. The electronic device of claim 17, wherein the at least one contact structure includes a first structure and a second structure,
  wherein the first structure includes a first magnet, and a first partition wall covering the first magnet and is electrically connected to the first ground of the first housing, and
  wherein the second structure is electrically connected to the second ground of the second housing.

19. The electronic device of claim 17, wherein the contact structure includes a first structure and a second structure,
  wherein the first structure includes:
    a first magnet,
    a first partition wall covering the first magnet,
    a second partition wall spaced apart from the first partition wall and surrounding the first partition wall, and
    an elastic member comprising a winding disposed between the first partition wall and the second partition wall and wound around the first partition wall, the first structure being electrically connected to the first ground of the first housing, and
  wherein the second structure includes a second magnet and a third partition wall covering the second magnet, the second structure being electrically connected to the second ground of the second housing.

20. The electronic device of claim 16, wherein, in the second state, the at least one contact structure is configured to electrically connect the first ground to the second ground.

* * * * *